US011180844B2

(12) United States Patent
Kitching

(10) Patent No.: US 11,180,844 B2
(45) Date of Patent: Nov. 23, 2021

(54) PROCESS FOR MAKING ALKALI METAL VAPOR CELLS

(71) Applicant: Government of the United States of America, as represented by the Secretary of Commerce, Gaithersburg, MD (US)

(72) Inventor: John Kitching, Boulder, CO (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 352 days.

(21) Appl. No.: 16/357,650

(22) Filed: Mar. 19, 2019

(65) Prior Publication Data
US 2020/0002802 A1  Jan. 2, 2020

Related U.S. Application Data

(60) Provisional application No. 62/692,970, filed on Jul. 2, 2018.

(51) Int. Cl.
*C23C 14/04* (2006.01)
*C23C 14/28* (2006.01)
(Continued)

(52) U.S. Cl.
CPC .......... *C23C 14/046* (2013.01); *B23K 1/0008* (2013.01); *B23K 1/20* (2013.01);
(Continued)

(58) Field of Classification Search
USPC .................................................... 427/248.1
See application file for complete search history.

(56) References Cited

U.S. PATENT DOCUMENTS

| 5,192,921 A | 3/1993 | Chantry et al. |
| 5,327,105 A | 7/1994 | Liberman et al. |

(Continued)

FOREIGN PATENT DOCUMENTS

EP    1895372 A2    3/2008

OTHER PUBLICATIONS

Knappe, S. et al., "Atomic Vapor Cells for Miniature Frequency References", IEEE International Frequency Control Symposium and PDA Exhibition Jointly with the 17th European Frequency and Time Forum, 2003, p. 31-32.

(Continued)

*Primary Examiner* — Brian K Talbot
(74) *Attorney, Agent, or Firm* — Office of Chief Counsel for National Institute of Standards and Technology

(57) ABSTRACT

Making alkali metal vapor cells includes: providing a preform wafer that includes cell cavities in a cavity layer; providing a sealing wafer having a cover layer and transmission apertures; disposing a deposition assembly on the sealing wafer; disposing an alkali metal precursor in the deposition assembly; disposing the sealing wafer on the preform wafer; aligning the transmission apertures with the cell cavities; subjecting the alkali metal precursor to a reaction stimulus; producing alkali metal vapor in the deposition assembly; communicating the alkali metal vapor to the cell cavities; receiving, in the cell cavities, the alkali metal vapor from the transmission apertures; producing an alkali metal condensate in the cell cavity; moving the sealing wafer such that the cover layer encapsulates the alkali metal condensate in the cell cavities; and bonding the sealing wafer to the preform wafer to make individually sealed alkali metal vapor cells in the preform wafer.

19 Claims, 15 Drawing Sheets

(51) Int. Cl.
  B23K 1/20    (2006.01)
  B23K 1/00    (2006.01)
  C23C 14/18   (2006.01)
(52) U.S. Cl.
  CPC ............. *C23C 14/18* (2013.01); *C23C 14/28* (2013.01); *B81C 2203/031* (2013.01); *Y10T 29/49982* (2015.01)

(56) References Cited

U.S. PATENT DOCUMENTS

| | | | |
|---|---|---|---|
| 5,670,914 | A | 9/1997 | Liberman et al. |
| 6,570,459 | B1 | 5/2003 | Nathanson et al. |
| 6,806,784 | B2 | 10/2004 | Hollberg et al. |
| 7,064,835 | B2 | 6/2006 | Riley, Jr. et al. |
| 8,071,019 | B2 | 12/2011 | Touchberry et al. |
| 8,299,860 | B2 | 10/2012 | Youngner et al. |
| 8,480,805 | B2 * | 7/2013 | Enzenroth ............. C23C 14/243 118/726 |
| 8,906,470 | B2 * | 12/2014 | Overstolz ................. G04F 5/14 427/557 |
| 9,568,565 | B2 * | 2/2017 | Parsa ........................ G04F 5/14 |
| 9,639,062 | B2 | 5/2017 | Dyer et al. |
| 10,447,286 | B2 * | 10/2019 | Park .......................... H03L 7/26 |
| 10,509,369 | B1 * | 12/2019 | Lemke ...................... H03L 7/26 |
| 10,605,840 | B1 * | 3/2020 | Amarloo ............. G01N 21/0303 |
| 10,859,981 | B1 * | 12/2020 | Ramirez-Serrano .... C03C 27/06 |
| 2005/0007118 | A1 * | 1/2005 | Kitching ................... G04F 5/14 324/464 |
| 2013/0176703 | A1 * | 7/2013 | Hopper ............... H01L 31/1804 361/820 |
| 2015/0107097 | A1 * | 4/2015 | Nagasaka ............ G01R 33/032 29/731 |
| 2015/0378316 | A1 | 12/2015 | Parsa et al. |
| 2016/0218726 | A1 * | 7/2016 | Overstolz ................. H03L 7/26 |

OTHER PUBLICATIONS

Knappe, S., et al., "Atomic Vapor Cells for Chip-Scale Atomic Clocks with Improved Long-Term Frequency Stability", Optic Letters, 2005, p. 2351-2353, vol. 30 No. 18.
Liew, L., et al., "Microfabricated Alkali Atom Vapor Cells", Applied Physics Letters, 2004, p. 2694-2696, vol. 84 No. 14.
Liew, L., et al., "Wafer-Level Filling of Microfabricated Atomic Vapor Cells Based on Thin-Film Deposition and Photolysis of Cesium Azide", Applied Physics Letters, 2007, p. 114106, vol. 90.
Kitching, J., "Chip-Scale Atomic Devices", Applied Physics Review, 2018, p. 031302, vol. 5.
Douahi, A., et al., "Vapour Microcell for Chip Scale Atomic Frequency Standard", Electronic Letters, 2007, vol. 43 No. 5.
Dural, N., et al., "Gallium Phosphide as a New Material for Anodically Bonded Atomic Sensors", APL Materials, 2014, p. 086101, vol. 2.
Ermak, S.V., et al., "Microfabricated Cells for Chip-Scale Atomic Clock Based on Coherent Population Trapping: Fabrication and Investigation", St. Petersburg Polytechnical University Journal: Physics and Mathematics 1, 2015, p. 37-41.
Espe, W., "Materials of High Vacuum Technology", Metals and Metalloids, 1966, p. 578-601, vol. 1.
Gong, F. et al., "Electrolytic Fabrication of Atomic Clock Cells", Review of Scientific Instruments, 2006, p. 076101, vol. 77.
Karlen,S., et al., "Lifetime Assessment of RbN3-filled MEMS Atomic Vapor Cells with Al2O3 Coating", Optics Express, 2017, p. 2187-2194, vol. 25 No. 3.
Liew, L., et al., "Wafer-Level Fabrication and Filling of Cesium-Vapor Resonance Cells for Chip-Scale Atomic Devices", Proceesings of 20th Eurosensors Conference, 2006.
Maurice, V., et al., "Microfabricated Vapor Cells Filled with a Cesium Dispensing Paste for Miniature Atomic Clocks", Applied Physics Letters, 2017, p. 164103, vol. 110.
Nathanson, H., et al., "Novel Functionality Using Micro-Gaseous Devices", IEEE, 1995, p. 72-76.
Nieradko, L., et al., "New Approach of Fabrication and Dispensing of Micromachined Cesium Vapor Cell", J. Micro/Nanolith. MEMS MOEMS, 2008, p. 033013, vol. 7 No. 3.
Straessle, R., et al., "Microfabricated Alkali Vapor Cell with Anti-Relaxation Wall Coating", Applied Physics Letters, 2014, p. 043502, vol. 105.
Vecchio, F., et al., "Dispensing and Hermetic Sealing Rb in a Miniature Reference Cell for Integrated Atomic Clocks", Sensors and Actuators A: Physical, 2011, p. 330-335, vol. 172.
Wallis, G., et al., "Field Assisted Glass-Metal Sealing", Journal of Applied Physics, 1969, p. 3946-3949, vol. 40 No. 10.
Woetzel, S., et al., Low-Temperature Anodic Bonding Using Thin Films of Lithium-Niobate-Phosphate Glass, Journal of Micromechanics and Microengineering, 2014, p. 095001, vol. 24.
Woetzel, S., et al., "Microfabricated Atomic Vapor Cell Arrays for Magnetic Field Measurement", Review of Scientific Instruments, 2011, p. 033111, vol. 82.

* cited by examiner (A)

(B)

(C)

(A)   250

(B)   250

(A)

(B)

(C)

(A)  220

(B)  220

(A)  212

(B)  212

(A)  214

(B)  214

(A)

(B)

(C)

(D)

(A)  250

(B)  250

(A) <u>210</u>

(B) <u>210</u>

(A)

(B)

(A) 220

(B) 220

(C) 220

(A)  220

(B)  220

PROCESS FOR MAKING ALKALI METAL VAPOR CELLS

CROSS REFERENCE TO RELATED APPLICATIONS

The application claims priority to U.S. Provisional Patent Application Ser. No. 62/692,970 filed Jul. 2, 2018, the disclosure of which is incorporated herein by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 301-975-2573; email tpo@nist.gov.

BRIEF DESCRIPTION

Disclosed is a process for making a plurality of alkali metal vapor cells in an alkali metal vapor cell fabrication apparatus, the process comprising: providing a preform wafer comprising: a basal member; a cavity layer disposed on the basal member; and a plurality of cell cavities disposed in the cavity layer and bounded by a cavity wall of the cavity layer; providing a sealing wafer comprising: a cover layer; and a plurality of transmission apertures disposed in the cover layer and bounded by a cover wall of the cover layer; disposing a deposition assembly on the sealing wafer in fluid communication with the transmission apertures of the sealing wafer such that the sealing wafer is interposed between the preform wafer and the deposition assembly; disposing an alkali metal precursor in the deposition assembly; disposing the sealing wafer on the preform wafer; aligning the transmission apertures of the sealing wafer with the cell cavities such that the transmission apertures of the sealing wafer are in fluid communication with the cell cavities of the preform wafer; subjecting the alkali metal precursor in the deposition assembly to a reaction stimulus; producing, from the alkali metal precursor, alkali metal vapor in the deposition assembly in response to subjecting the alkali metal precursor to the reaction stimulus; communicating, simultaneously in parallel, the alkali metal vapor from the deposition assembly to the cell cavities through the transmission apertures; receiving, in the cell cavities, the alkali metal vapor from the transmission apertures; producing, from the alkali metal vapor, an alkali metal condensate in the cell cavity; moving the sealing wafer laterally with respect to the preform wafer such that the cover layer encapsulates the alkali metal condensate in the cell cavities; and bonding the sealing wafer to the preform wafer to make individually sealed alkali metal vapor cells in the preform wafer.

Disclosed is a process for making a plurality of alkali metal vapor cells in an alkali metal vapor cell apparatus, the process comprising: providing the preform wafer comprising: a basal member; a cavity layer disposed on the basal member; a plurality of cell cavities disposed in the cavity layer and bounded by a cavity wall of the cavity layer; and a plurality of deposition cavities disposed in the cavity layer and bounded by the cavity wall of the cavity layer, such that each deposition cavity is adjacent to a cell cavity; disposing an alkali metal precursor in the deposition cavity of the preform wafer; providing a sealing wafer comprising a cover layer that comprises a blank; disposing the sealing wafer on the preform wafer so that a deposition surface of the sealing wafer faces and is in fluid communication with the deposition cavities of the preform wafer, such that the deposition cavities are individually isolated from fluid communication with other deposition cavities and cell cavities; subjecting the alkali metal precursor in the deposition cavities to a reaction stimulus; producing, from the alkali metal precursor, alkali metal vapor in the deposition cavities in response to subjecting the alkali metal precursor to the reaction stimulus; communicating, simultaneously in parallel, the alkali metal vapor from the deposition cavity to a deposition area on the deposition surface of the sealing wafer that covers the deposition cavity, such that each deposition area is local to an individual deposition cavity and physically separate from other deposition cavities and cell cavities; contacting the deposition area with the alkali metal vapor from the deposition cavity; producing, from the alkali metal vapor, an alkali metal condensate on the deposition area; separating the sealing wafer from the preform wafer; moving the sealing wafer laterally with respect to the preform wafer and aligning the deposition areas of the sealing wafer with the cell cavities of the preform wafer such that the individual deposition areas of the sealing wafer are in fluid communication with an individual cell cavity of the preform wafer in an aligned position and contacting the sealing wafer with the preform wafer in the aligned position to encapsulate the alkali metal condensate in individual deposition areas in individual cell cavities; and bonding the sealing wafer to the preform wafer to make individually sealed alkali metal vapor cells in the preform wafer.

BRIEF DESCRIPTION OF THE DRAWINGS

The following description should not be considered limiting in any way. With reference to the accompanying drawings, like elements are numbered alike.

DETAILED DESCRIPTION

Figure 1:
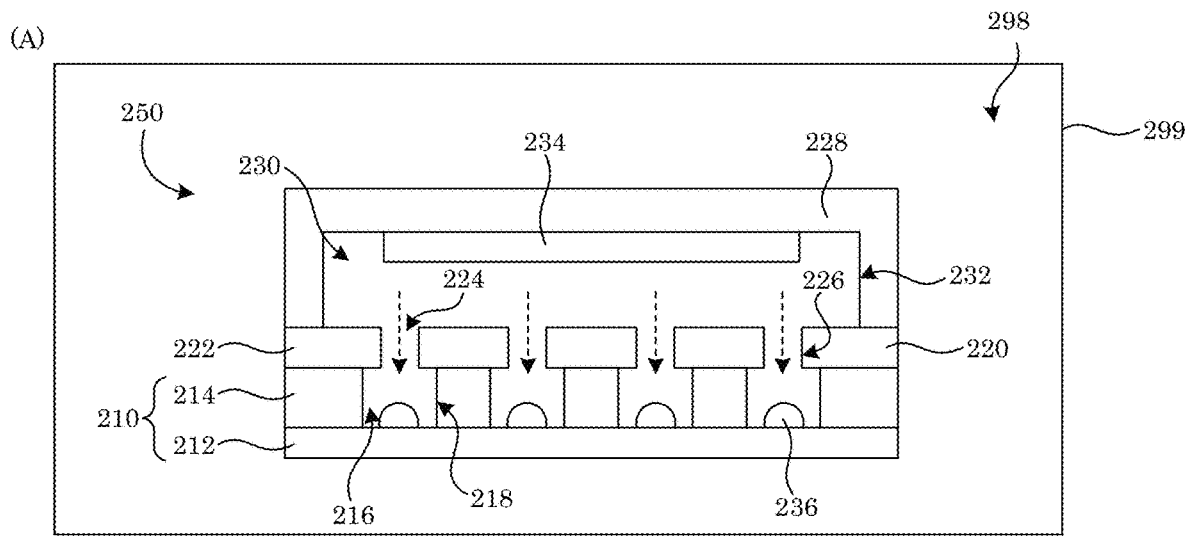
FIG. 1 shows steps in a process for making a plurality of alkali metal vapor cells from an alkali metal vapor cell apparatus.
Figure 1:
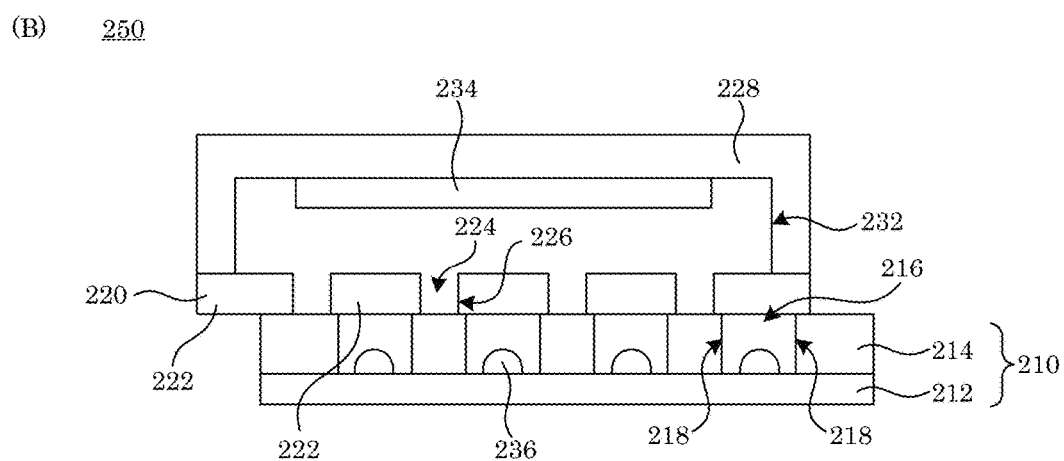
Figure 1:
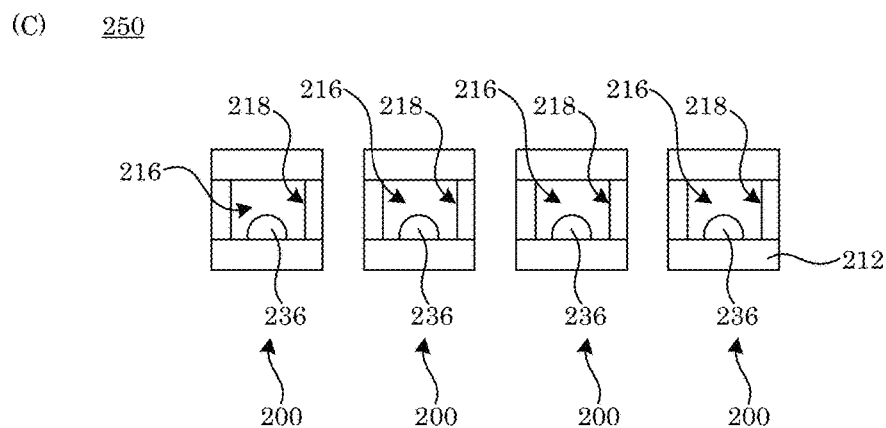
Figure 2:
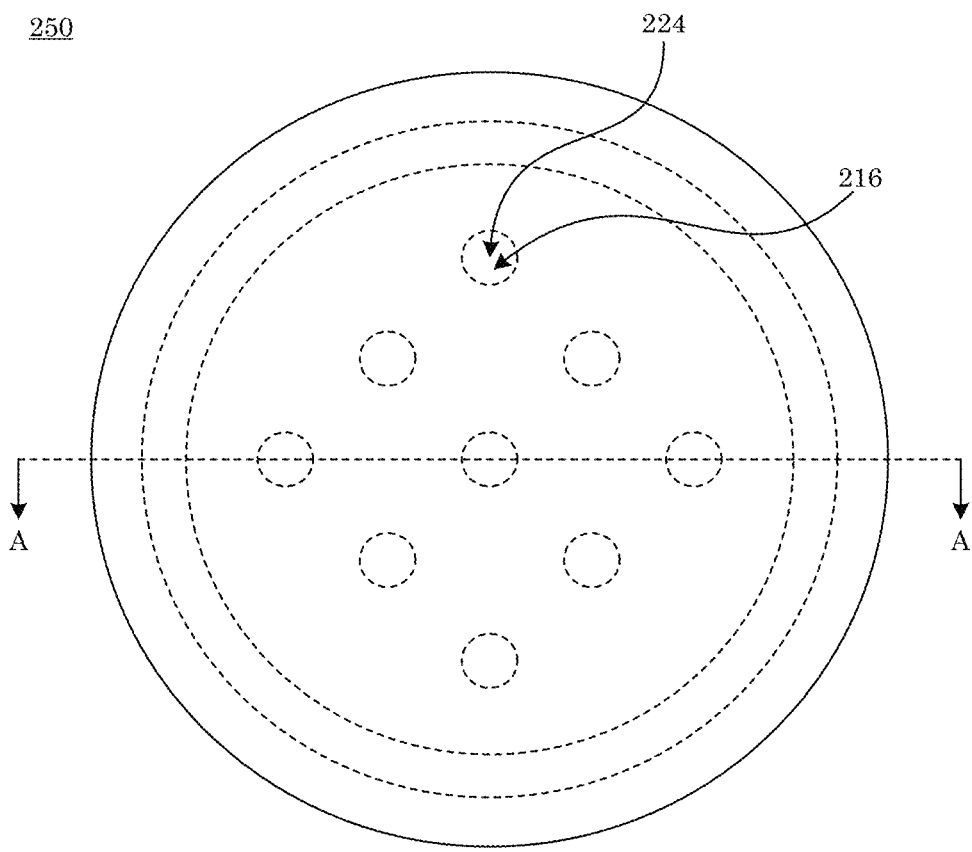
FIG. 2 shows a plan view of an alkali metal vapor cell apparatus in panel A and a cross-section along line A-A in panel B.
Figure 2:
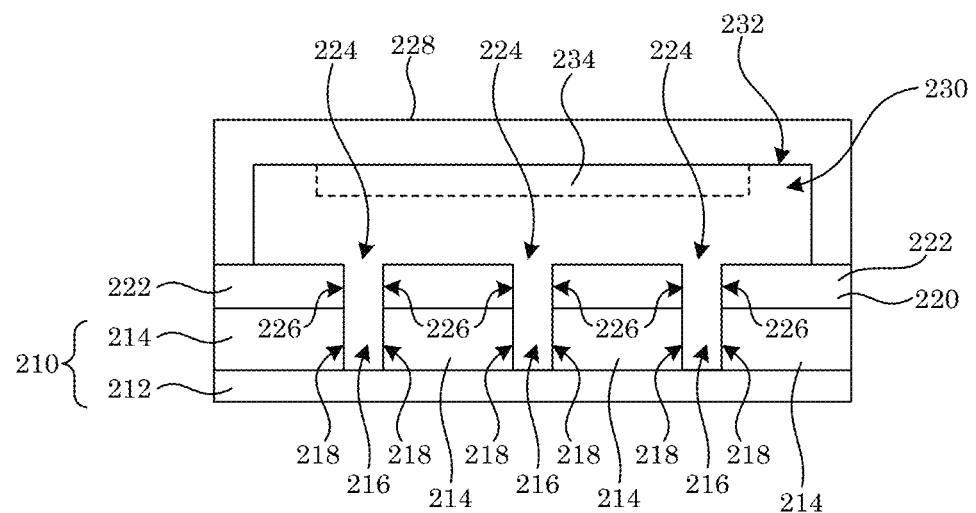
Figure 3:
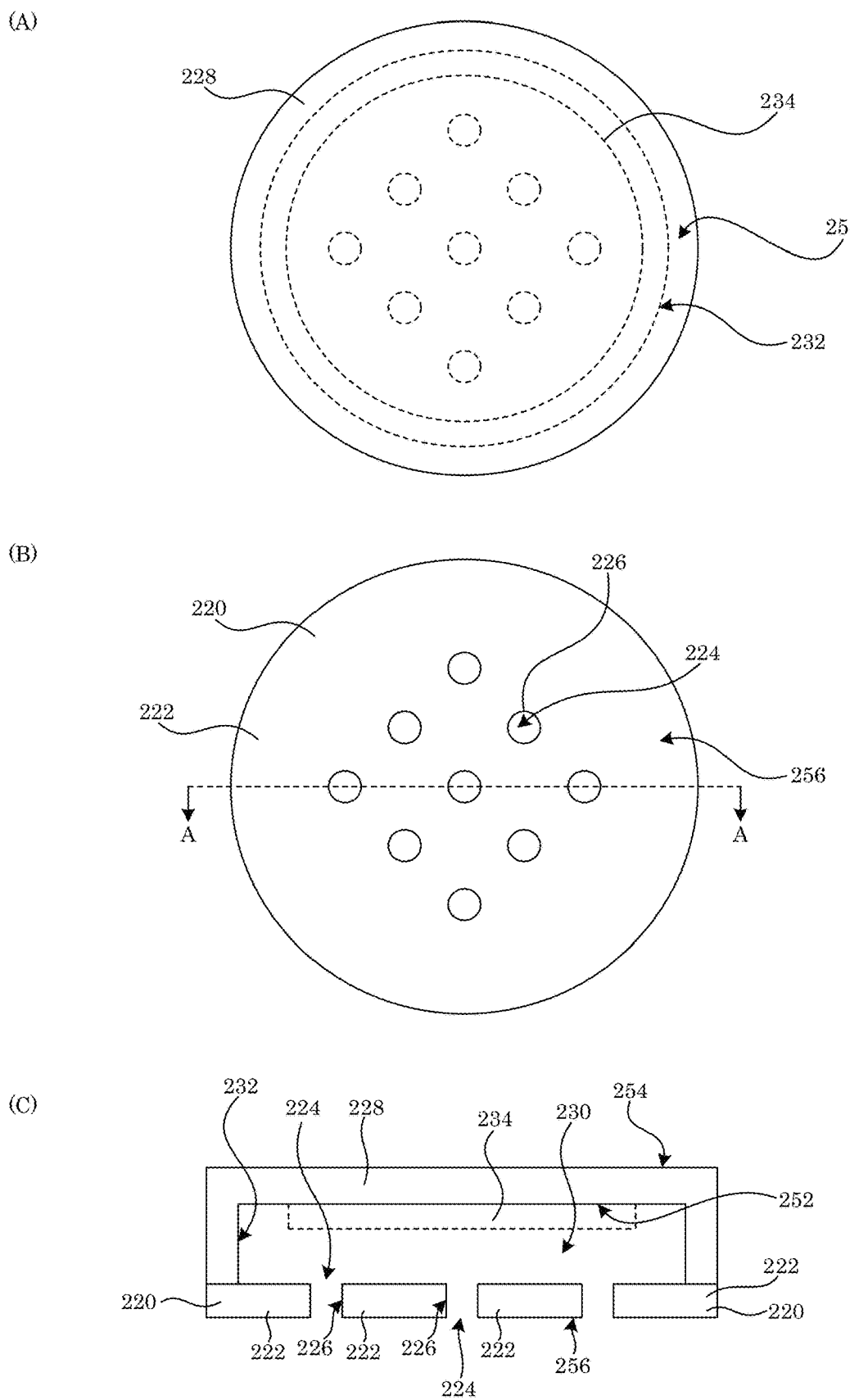
FIG. 3 shows, in panel A, a plan view of a deposition assembly disposed on a sealing wafer of the alkali metal vapor cell apparatus shown in FIG. 2, a cover surface of a sealing wafer in panel B, and in panel C a cross-section along line A-A shown in panel B for the deposition assembly disposed on the sealing wafer.
Figure 4:
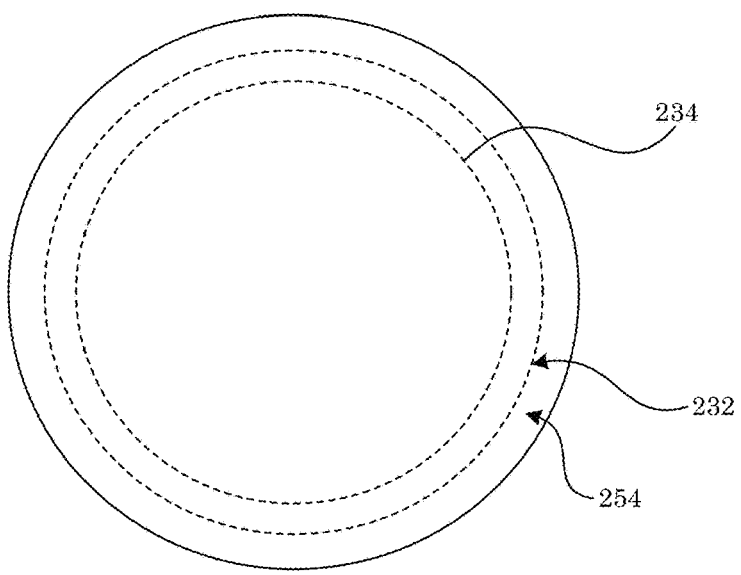
FIG. 4 shows (in panel A) a plan view of the deposition assembly shown in FIG. 3, a bottom view of the deposition assembly in panel B, and in panel C a cross-section along line A-A shown in panel B for the deposition assembly.
Figure 4:
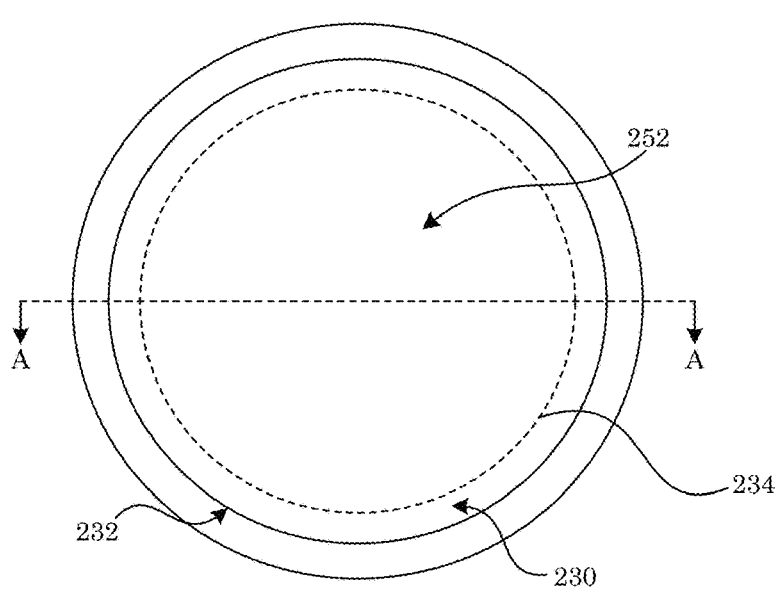
Figure 4:
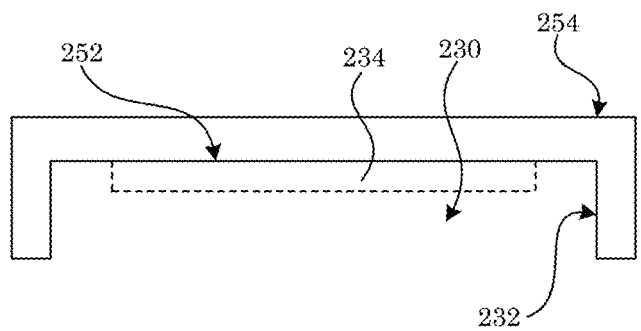
Figure 5:
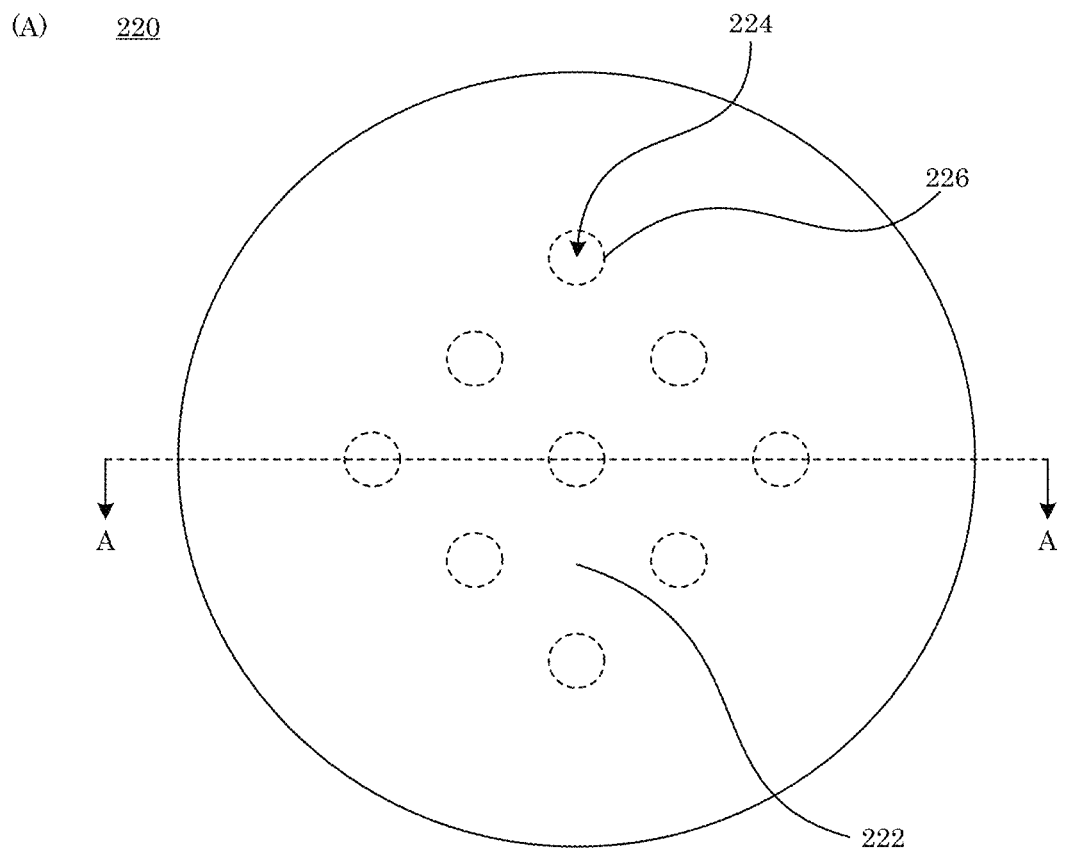
FIG. 5 shows (in panel A) a plan view of a sealing wafer shown in FIG. 2 and, in panel B, a cross-section along line A-A shown in panel B.
Figure 5:
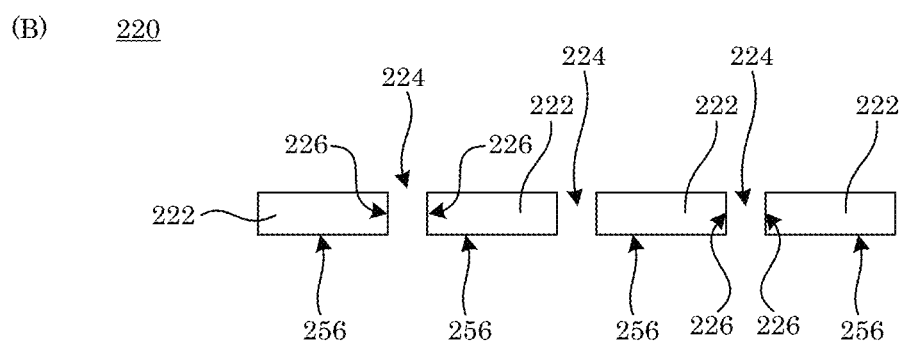
Figure 6:
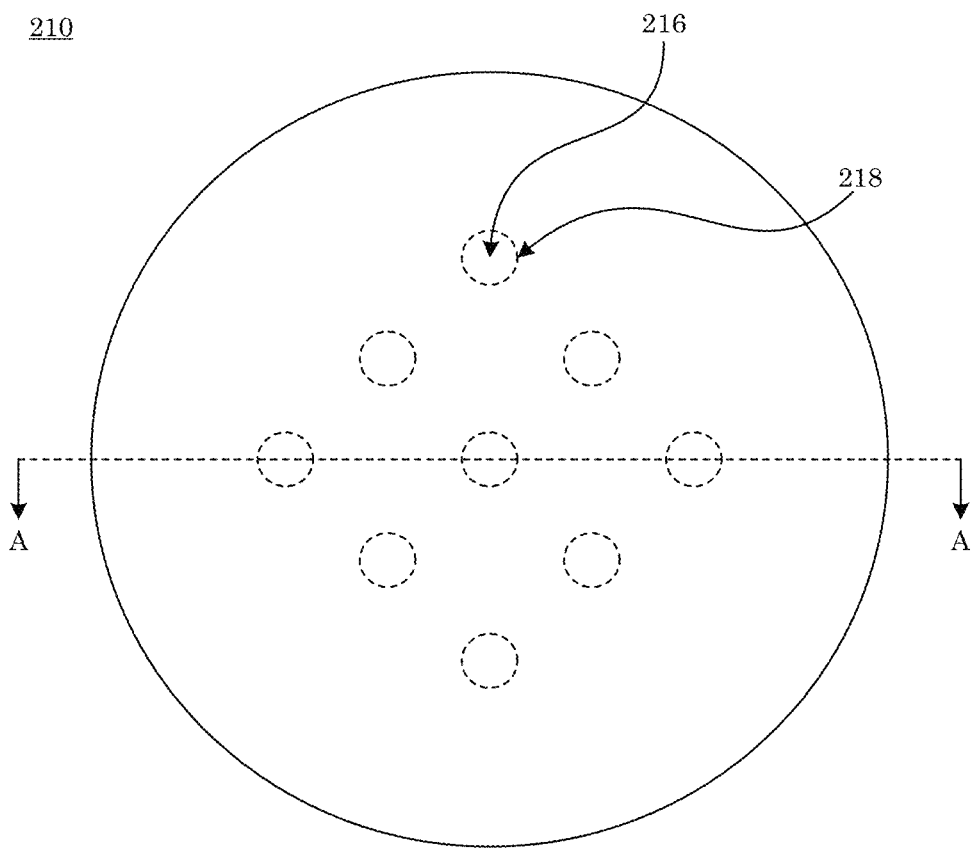
FIG. 6 shows, in panel A, a plan view of a preform wafer that includes cavity layer 214 on a basal member for the alkali metal vapor cell apparatus shown in FIG. 2 and, in panel B, a cross-section along line A-A shown in panel A.
Figure 6:
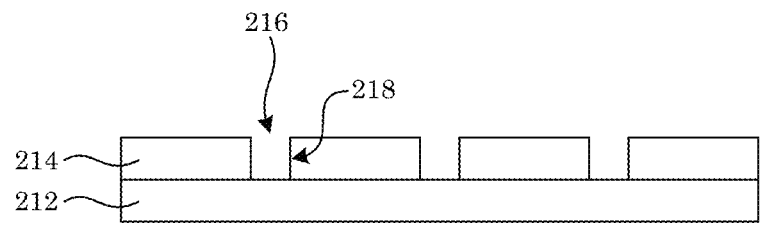
Figure 7:
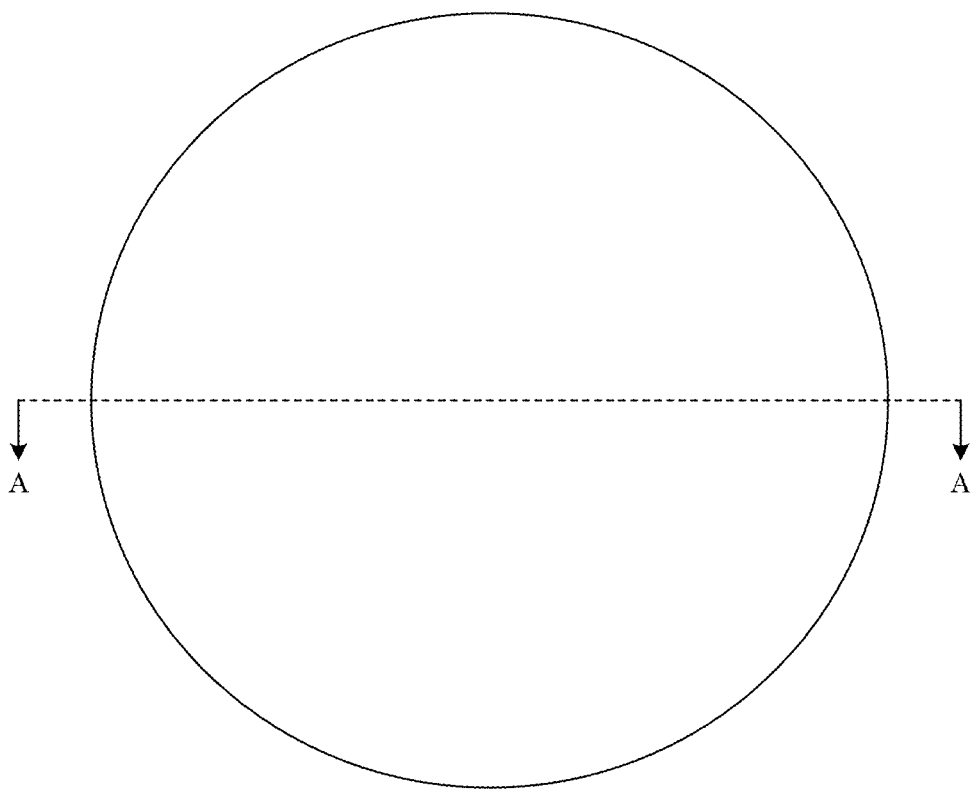
FIG. 7 shows, in panel A, a plan view of a basal member of the preform wafer for the alkali metal vapor cell apparatus shown in FIG. 2 and, in panel B, a cross-section along line A-A shown in panel A.
Figure 7:
Figure 8:
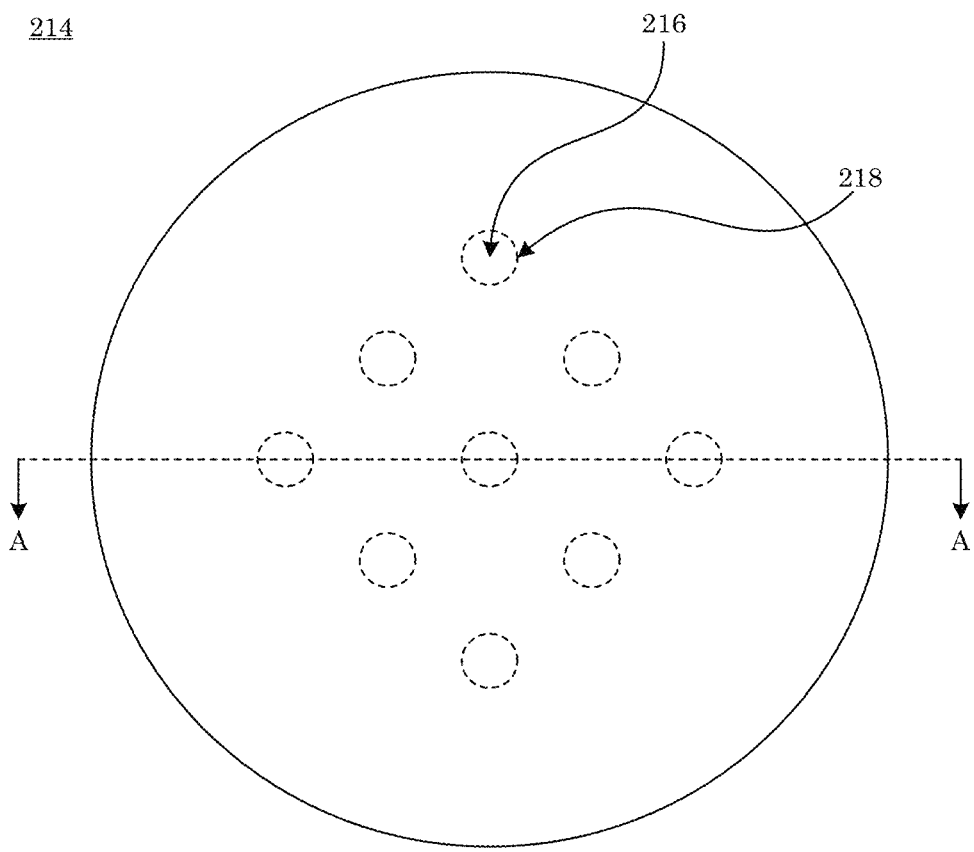
FIG. 8 shows, in panel A, a plan view of a cavity layer of the preform wafer for the alkali metal vapor cell apparatus shown in FIG. 2 and, in panel B, a cross-section along line A-A shown in panel A.
Figure 8:
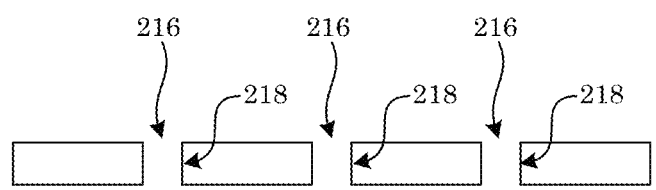
Figure 9:
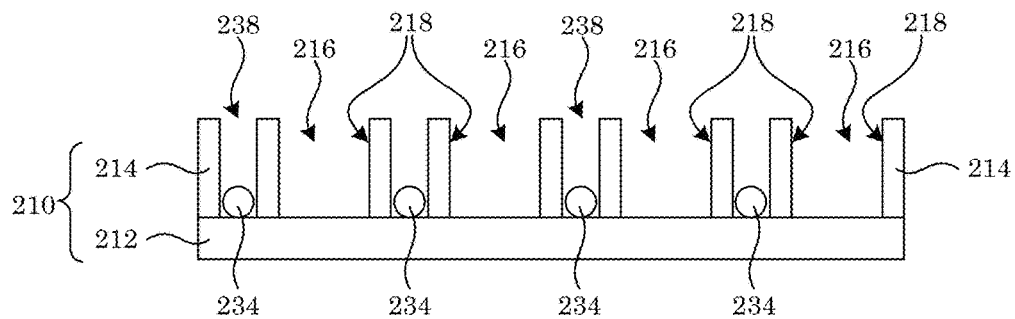
FIG. 9 shows steps in a process for making a plurality of alkali metal vapor cells from an alkali metal vapor cell apparatus.
Figure 9:
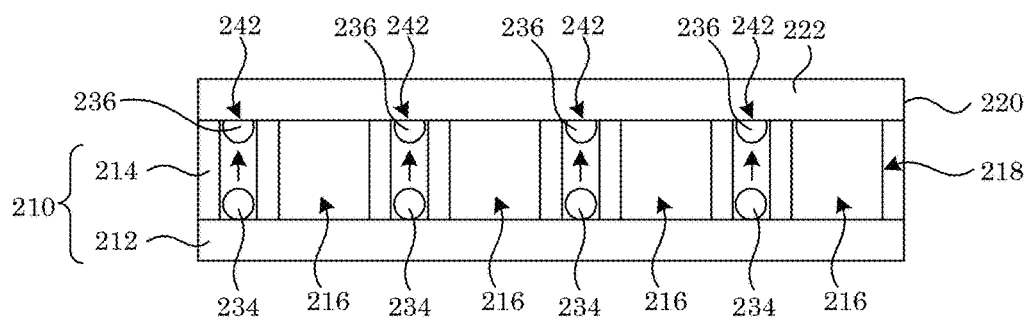
Figure 9:
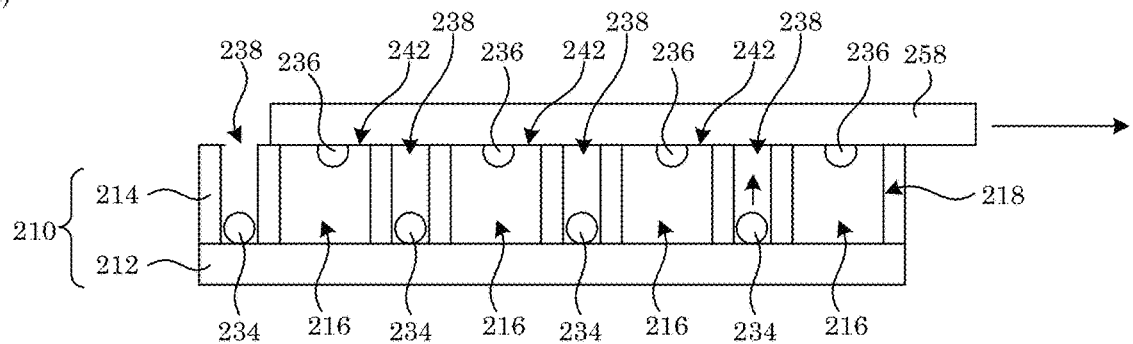
Figure 9:
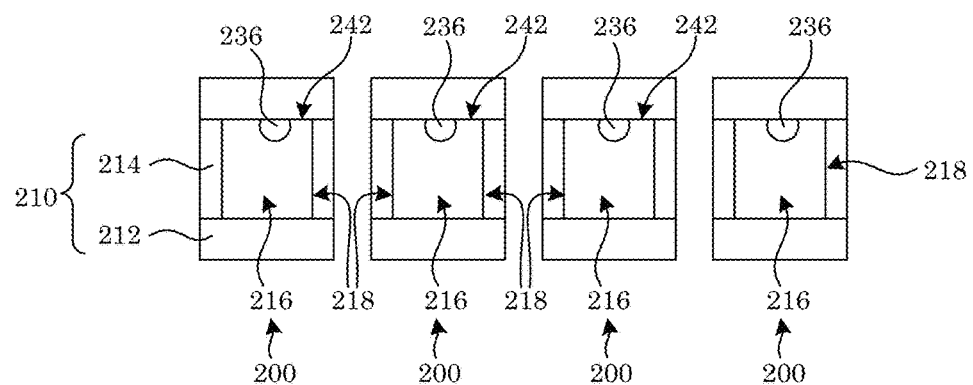
Figure 10:
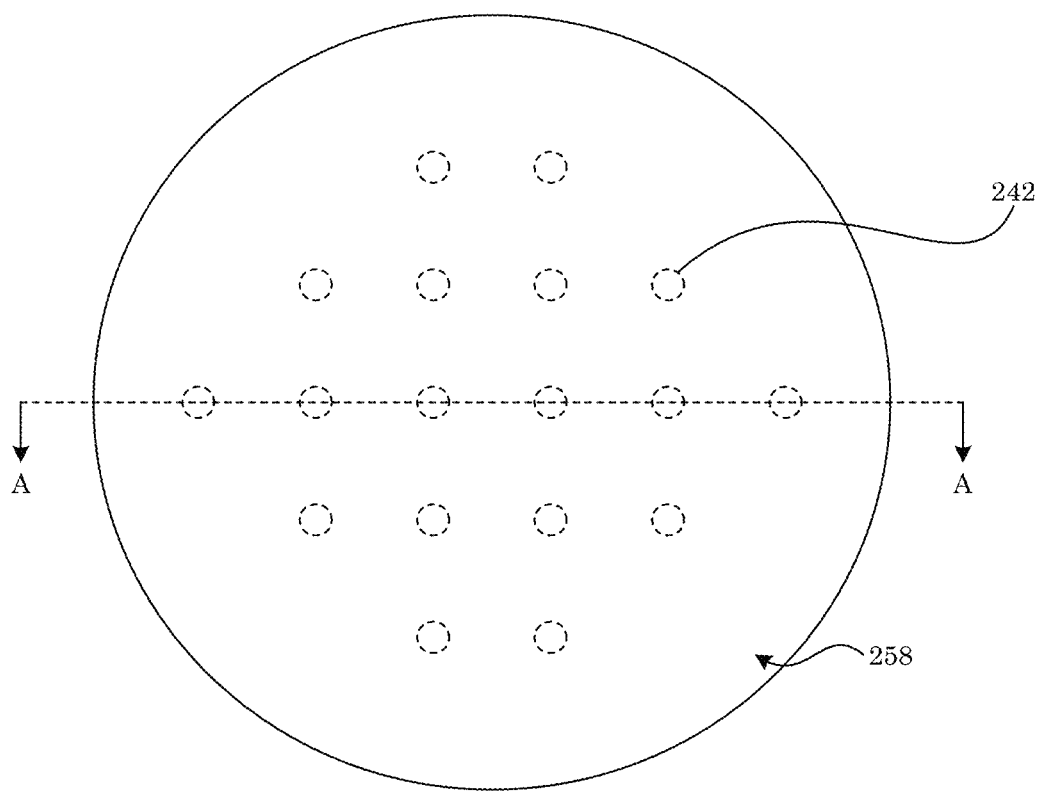
FIG. 10 shows a plan view of an alkali metal vapor cell apparatus in panel A and a cross-section along line A-A in panel B.
Figure 10:
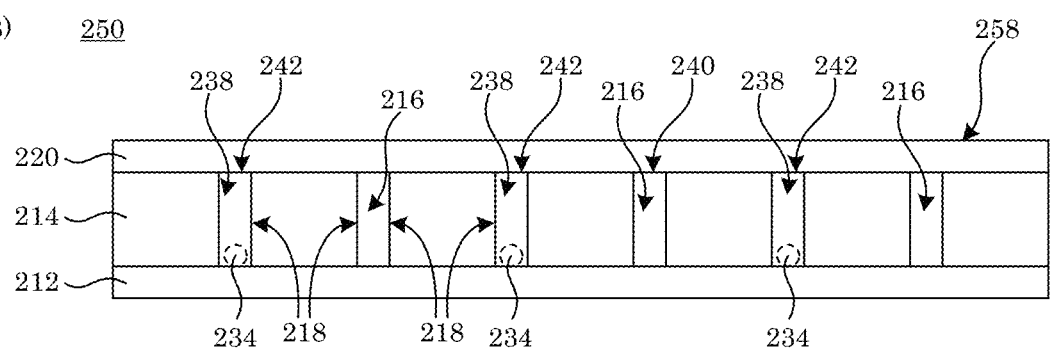

A detailed description of one or more embodiments is presented herein by way of exemplification and not limitation.

It has been discovered that a process for making alkali metal vapor cells provides millimeter-scale and sub-millimeter alkali metal vapor cells in large numbers at a wafer scale that include a vapor of alkali atoms. Advantageously, in the process, a glass lid wafer as a sealing wafer is translated laterally with respect to a preform wafer after depositing an alkali metal condensate 236 and before bonding the sealing wafer to the preform wafer. Holes in the sealing wafer that are connected to the deposition assembly, or a second array of holes in the cavity layer, and filled with a chemical precursor, provide a source of alkali atoms to be integrated as part of one of the wafers and eliminates a separate alkali atom source, which can be complicated, contaminant-infused, or inefficient to implement. Beneficially, processes for making alkali metal vapor cells herein provide alkali metal vapor cells in large numbers in parallel at a wafer-scale, rather than producing the alkali metal vapor cells individually in serial. As used herein, "wafer-scale" refers to making a plurality of alkali metal vapor cells on a single wafer simultaneously in parallel, wherein a number of individual alkali metal vapor cells produced on the single wafer can be, e.g., 1000 vapor cells on a single 4-inch wafer. Unexpectedly, the processes produce very clean alkali metal vapor cells that can include a selected buffer gas or an absence of buffer gas.

Conventional fabrication of cells based on deposition of alkali metal are complicated and can involve two moving elements so that conventional processing is difficult to implement in conventional bonding tools that have one moving element. Processes herein overcome this technical problem. Moreover, the alkali metal vapor cells provided herein are sealed cells containing a vapor of alkali metal such as potassium, rubidium or cesium and can be used in atomic clocks, magnetometers, and other instruments. The processes herein considerably lower fabrication costs than conventional methods of fabricating vapor cells.

The processes herein further overcome technical problems making alkali metal vapor cells with micromachined silicon and glass and solves the problem of how to dispose alkali metal atoms into a cell and how to seal the cell so that the cells contain highly pure alkali metal atoms even though alkali metal is highly reactive and difficult to handle. Beneficially, the processes herein overcome undesirable reaction products inside the cells. These undesirable reaction products can cause difficulties in using the cells by, e.g., obscuring optical access through cell windows or causing changes in the cell environment after bonding. However, absence of undesirable reaction products is achieved in the processes herein.

In an embodiment, with reference to FIG. 1, FIG. 2, FIG. 3, FIG. 4, FIG. 5, FIG. 6, FIG. 7, and FIG. 8, a process for making a plurality of alkali metal vapor cells 200 in preform wafer 210 includes: providing preform wafer 210. Preform wafer 210 includes basal member 212; cavity layer 214 disposed on basal member 212; and a plurality of cell cavities 216 disposed in cavity layer 214 and bounded by cavity wall 218 of cavity layer 214. The process also includes providing sealing wafer 220. Sealing wafer 220 includes cover layer 222 and a plurality of transmission apertures 224 disposed in cover layer 222 and bounded by cover wall 226 of cover layer 222. The process also includes disposing deposition assembly 228 on sealing wafer 220 in fluid communication with transmission apertures 224 of sealing wafer 220 such that sealing wafer 220 is interposed between preform wafer 210 and deposition assembly 228; disposing alkali metal precursor 234 in deposition assembly 228; disposing sealing wafer 220 on preform wafer 210; aligning transmission apertures 224 of sealing wafer 220 with cell cavities 216 such that transmission apertures 224 of sealing wafer 220 are in fluid communication with cell cavities 216 of preform wafer 210; subjecting alkali metal precursor 234 in deposition assembly 228 to a reaction stimulus; producing, from alkali metal precursor 234, alkali metal vapor in deposition assembly 228 in response to subjecting alkali metal precursor 234 to the reaction stimulus; communicating, simultaneously in parallel, the alkali metal vapor from deposition assembly 228 to cell cavities 216 through transmission apertures 224; receiving, in cell cavities 216, alkali metal vapor from transmission apertures 224; optionally producing, from the alkali metal vapor, alkali metal condensate 236 in cell cavity 216; moving sealing wafer 220 laterally with respect to preform wafer 210 such that cover layer 222 encapsulates alkali metal condensate 236 in cell cavities 216; and bonding sealing wafer 220 to preform wafer 210 to make individually sealed alkali metal vapor cells 200 in preform wafer 210. As used herein, "sealed" and variants thereof (e.g., seal, sealing, and the like) refer to a fluid impermeable barrier the prevents communication of fluids into or out of alkali metal vapor cell 200.

After making the alkali metal vapor cells 200, the process can include removing deposition assembly 228 from sealing wafer 220 after producing, from alkali metal precursor 234, alkali metal vapor in deposition assembly 228. In an embodiment, the process further includes dicing, after bonding sealing wafer 220 to preform wafer 210, preform wafer 210 to provide a select number of individually sealed alkali metal vapor cells 200. The process can include introducing a buffer gas in cell cavity 216, wherein the alkali metal is inert to the buffer gas.

In the process for making alkali metal vapor cell 200 with alkali metal vapor cell apparatus 250, disposing deposition assembly 228 on sealing wafer 220 in fluid communication with transmission apertures 224 of sealing wafer 220 such that sealing wafer 220 is interposed between preform wafer 210 and deposition assembly 228 includes mechanical clamping of deposition assembly 228 to sealing wafer 220 with a spring or screw-based clamp designed and adjusted to press the two components together; chemical adhesion of deposition assembly 228 to sealing wafer 220 with appropriate glue or other adhesive; or wafer-bonding of deposition assembly 228 to sealing wafer 220 by anodic bonding, fusion bonding, or eutectic bonding.

In the process for making alkali metal vapor cell 200, disposing alkali metal precursor 234 in deposition assembly 228 includes delivering a liquid solution that includes alkali metal precursor 234 into deposition assembly 228; and heating the liquid to evaporate the solvent leaving the precursors in deposition assembly 228 in solid form. Heating can occur by placing the deposition assembly 228 on a heated surface. Optionally, the liquid composition can be dried by exposing the liquid composition to a dry gaseous environment. Upon drying the liquid composition, alkali metal precursor 234 is stable at room temperature.

In the process for making alkali metal vapor cell 200, disposing sealing wafer 220 on preform wafer 210 includes introducing sealing wafer 220 and preform wafer 210 into an evacuated bonding chamber 299; translating 220 with respect to 210 such that 220 comes into contact with 210; and lateral aligning wafers.

In the process for making alkali metal vapor cell 200, aligning transmission apertures 224 of sealing wafer 220 with cell cavities 216 includes depositing alignment marks on bonding sealing wafer 220 and cavity layer 214, the alignment marks being visible from outside bonding chamber 299 when alkali metal vapor cell apparatus 250 is inside bonding chamber 299. Alignment of alignment marks is with respect to each other before reaction of chemical precursors 234 to align transmission apertures 224 to cell cavities 216. Accordingly, after alignment, transmission apertures 224 of sealing wafer 220 are in fluid communication with cell cavities 216 of preform wafer 210.

In the process for making alkali metal vapor cell 200, subjecting alkali metal precursor 234 in deposition assembly 228 to a reaction stimulus includes heating the alkali metal precursors to elevated temperature after insertion of deposition assembly 228 and preform wafer 210 into bonding chamber 299 and evacuation of this chamber of gas. In an embodiment, subjecting alkali metal precursor 234 in deposition assembly 228 to the reaction stimulus includes heating alkali metal precursor 234. Here, electrically resistive heaters in the platen of the bonding machine that hold deposition assembly 228 are activated by passing an electrical current through them, which results in them getting hot and heat transferred to deposition assembly 228 and alkali metal precursor 234. In an embodiment, subjecting alkali metal precursor 234 in deposition assembly 228 to the reaction stimulus includes irradiating alkali metal precursor 234 with ultraviolet radiation. Here, ultraviolet light, e.g., from a discharge lamp or laser, is transmitted into deposition assembly 228 through windows on deposition assembly 228 transparent to ultraviolet light.

In the process for making alkali metal vapor cell 200, producing, from alkali metal precursor 234, alkali metal vapor in deposition assembly 228 in response to subjecting alkali metal precursor 234 to the reaction stimulus includes a chemical reaction that occurs between alkali metal precursors, one of which is a compound containing an alkali atom. Under the reaction stimulus, the alkali metal precursors react to form pure alkali metal and a reaction product not subsequently used. The pure alkali metal evaporates to fill deposition assembly 228 with an alkali metal vapor.

In the process for making alkali metal vapor cell 200, communicating, simultaneously in parallel, the alkali metal vapor from deposition assembly 228 to cell cavities 216 through transmission apertures 224 includes heating of the deposition assembly to form a vapor of sufficient pressure and effusing the alkali vapor through the transmission apertures.

In the process for making alkali metal vapor cell 200, receiving, in cell cavities 216, alkali metal vapor from transmission apertures 224 includes applying a temperature difference between deposition assembly 228 and preform wafer 210 and condensing the alkali vapor as a solid or liquid alkali metal condensate 236 onto the surface of the cell cavities 216.

In the process for making alkali metal vapor cell 200, moving sealing wafer 220 laterally with respect to preform wafer 210 such that cover layer 222 encapsulates alkali metal condensate 236 in cell cavities 216 includes moving cover layer 222 with respect to preform wafer 210 perpendicular to the wafer surfaces (e.g., vertically) to separate the wafers; lateral translation of cover layer 222 with respect to preform wafer 210 using mechanical manipulators; and translating, e.g., in a vertical direction, cover layer 222 with respect to preform wafer 210 such that the wafers are once again in contact.

In the process for making alkali metal vapor cell 200, bonding sealing wafer 220 to preform wafer 210 to make individually sealed alkali metal vapor cells 200 in preform wafer 210 can include anodic bonding, thermocompression bonding, fusion bonding, eutectic bonding, or a combination thereof. In an embodiment, bonding is anodic bonding that includes applying an elevated voltage across a conductive wafer and a glass or ceramic wafer placed in surface contact at elevated temperature such that impurity ions in the wafers are transported within the wafers resulting in electrostatic forces and an oxidation process at the interface that bonds the wafers together. In an embodiment, bonding is fusion bonding that includes placing two silicon wafers in contact after appropriate processing of the wafer surfaces; heating to elevated temperature to form the bond; subsequent annealing at elevated temperature. In an embodiment, bonding is eutectic bonding that includes depositing metallic films on the wafer surfaces; aligning of the wafers such that the surfaces are in contact and the metallic films are in contact; and heating to an elevated temperature to allow the metallic films to diffuse into one another. As a result of bonding sealing wafer 220 to preform wafer 210, alkali metal vapor cells 200 are individually sealed.

The process can include removing deposition assembly 228 from sealing wafer 220 by abrasive machining, laser cutting or chemical etching. In an embodiment, the process further includes dicing, after bonding sealing wafer 220 to preform wafer 210, preform wafer 210 to provide a select number of individually sealed alkali metal vapor cells 200. Dicing includes abrasive machining or laser cutting of the parts of the wafer between the cells 200 without disrupting the seal formed by the bonding.

In some embodiments, the process includes introducing a buffer gas in cell cavity 216, wherein the alkali metal is disposed in buffer gas. Introducing the buffer gas can include filling bonding chamber interior 298 of bonding chamber 299 in which alkali metal vapor cell apparatus 250 is enclosed with the buffer gas after the alkali metal precursors are reacted, but before bonding; and performing bonding in the presence of the buffer gas to seal the gas inside the cell cavity 216.

Alkali metal precursor 234 can be disposed on chamber wall 232 of deposition assembly 228 that opposed cell cavity 216 in cavity layer 214 of preform wafer 210. In an embodiment, with reference to FIG. 9, FIG. 10, FIG. 11, FIG. 12, FIG. 13, FIG. 14, and FIG. 15, cavity layer 214 includes deposition cavity 238 bounded by cavity wall 218 and disposed among cell cavity 216. Here, a process for making a plurality of alkali metal vapor cells 200 in alkali metal vapor cell apparatus 250 includes providing preform wafer 210. Preform wafer 210 includes basal member 212; cavity layer 214 disposed on basal member 212; a plurality of cell cavities 216 disposed in cavity layer 214 and bounded by cavity wall 218 of cavity layer 214; and a plurality of deposition cavities 238 disposed in cavity layer 214 and bounded by cavity wall 218 of cavity layer 214, such that each deposition cavity 238 is adjacent to a cell cavity 216. The process also includes disposing alkali metal precursor 234 in deposition cavity 238 of preform wafer 210; and providing sealing wafer 220. Sealing wafer 220 includes cover layer 222 that can be a blank. The process also includes disposing sealing wafer 220 on preform wafer 210 so that deposition surface 240 of sealing wafer 220 faces and is in fluid communication with deposition cavities 238 of preform wafer 210, such that deposition cavities 238 are individually isolated from fluid communication with other deposition cavities 238 and cell cavities 216; subjecting alkali metal precursor 234 in deposition cavities 238 to a reaction stimulus; producing, from alkali metal precursor 234, alkali metal vapor in deposition cavities 238 in response to subjecting alkali metal precursor 234 to the reaction stimulus; communicating, simultaneously in parallel, the alkali metal vapor from deposition cavity 238 to deposition area 242 on deposition surface 240 of sealing wafer 220 that covers deposition cavity 238, such that each deposition area 242 is local to an individual deposition cavity 238 and physically separate from other deposition cavities 238 and cell cavities 216; optionally contacting deposition area 242 with the alkali metal vapor from deposition cavity 238; producing, from alkali metal vapor, alkali metal condensate 236 on deposition area 242; separating sealing wafer 220 from preform wafer 210; moving sealing wafer 220 laterally with respect to preform wafer 210 and aligning deposition areas 242 of sealing wafer 220 with cell cavities 216 of preform wafer 210 such that individual deposition areas 242 of sealing wafer 220 are in fluid communication with an individual cell cavity 216 of preform wafer 210 in an aligned position and contacting sealing wafer 220 with preform wafer 210 in the aligned position to encapsulate alkali metal condensate 236 in individual deposition area 242 in individual cell cavities 216; and bonding sealing wafer 220 to preform wafer 210 to make individually sealed alkali metal vapor cells 200 in preform wafer 210.

In the process for making alkali metal vapor cell 200, disposing alkali metal precursor 234 in deposition cavity 238 of preform wafer 210 includes mixing precursor materials in solid form or dissolved into a liquid and the deposition of mixed precursor materials into deposition cavity 238 by manual or automated injection.

In the process for making alkali metal vapor cell 200, disposing sealing wafer 220 on preform wafer 210 so that deposition surface 240 of sealing wafer 220 faces and is in fluid communication with deposition cavities 238 of preform wafer 210 includes manual or automated motion of the sealing wafer 220 with respect to the preform wafer 210 within the bonding chamber 299.

In the process for making alkali metal vapor cell 200, subjecting alkali metal precursor 234 in deposition cavities 238 to a reaction stimulus includes heating the alkali metal precursors to elevated temperature after insertion of sealing wafer 220 and preform wafer 210 into the bonding chamber 299 and evacuation of this chamber of gas. In an embodiment, subjecting alkali metal precursor 234 in deposition assembly 228 to the reaction stimulus includes heating alkali metal precursor 234. Here, electrically resistive heaters in the platen of the bonding machine that hold the deposition assembly 228 are activated by passing an electrical current through them, which results in them getting hot and the heat being transferred to the deposition assembly 228 and alkali metal precursor 234. In an embodiment, subjecting alkali metal precursor 234 in deposition assembly 228 to the reaction stimulus includes irradiating alkali metal precursor 234 with ultraviolet radiation. Here, ultraviolet light, e.g., from a discharge lamp or laser, can be transmitted into deposition assembly 228 through windows on deposition assembly 228 that are transparent to ultraviolet light.

In the process for making alkali metal vapor cell 200, producing, from alkali metal precursor 234, alkali metal vapor in deposition cavities 238 in response to subjecting alkali metal precursor 234 to the reaction stimulus includes a chemical reaction that occurs between two or more alkali metal precursors, one of which is a compound containing an alkali atom. Under the reaction stimulus, the alkali metal precursors react to form pure alkali metal and additional reaction products not subsequently used. The pure alkali metal then evaporates to fill the deposition cavity 238 with an alkali metal vapor.

In the process for making alkali metal vapor cell 200, communicating, simultaneously in parallel, the alkali metal vapor from deposition cavity 238 to deposition area 242 on deposition surface 240 of sealing wafer 220 that covers deposition cavity 238 includes heating of the deposition assembly to form a vapor of sufficient pressure and the effusion of this alkali vapor toward deposition surface 240.

In the process for making alkali metal vapor cell 200, producing, from alkali metal vapor, alkali metal condensate 236 on deposition area 242 includes forming a temperature differential between preform wafer 210 and sealing wafer 220 such that the alkali metal condenses in solid or liquid form on the deposition area 242.

In the process for making alkali metal vapor cell 200, separating sealing wafer 220 from preform wafer 210 includes the manual or automated motion of the sealing wafer vertically with respect to the preform wafer inside the vacuum chamber without exposing deposition surface 240 to oxidizing gas such as oxygen or water vapor.

In the process for making alkali metal vapor cell 200, moving sealing wafer 220 laterally with respect to preform wafer 210 and aligning deposition areas 242 of sealing wafer 220 with cell cavities 216 of preform wafer 210 includes the manual or automated motion of sealing wafer 220 with respect to preform wafer 210 within the vacuum chamber using mechanical actuators; alignment of sealing wafer 220 with respect to preform wafer 210 using alignment marks deposited onto, or etched into, the wafers using lithographic processes; and verification relative alignment of the wafers with an imaging systems. As a result, individual deposition areas 242 of sealing wafer 220 are in fluid communication with an individual cell cavity 216 of preform wafer 210 in an aligned position and in the aligned position encapsulate alkali metal condensate 236 in individual deposition area 242 in individual cell cavities 216.

In the process for making alkali metal vapor cell 200, bonding sealing wafer 220 to preform wafer 210 to make individually sealed alkali metal vapor cells 200 in preform wafer 210 includes applying an elevated voltage across a conductive wafer and a glass or ceramic wafer placed in surface contact at elevated temperature such that impurity ions in the wafers are transported within the wafers resulting in electrostatic forces and an oxidation process at the interface that bonds the wafers together. In an embodiment, bonding is fusion bonding that includes placing two silicon wafers in contact after appropriate processing of the wafer surfaces; and heating to elevated temperature to form the bond; subsequent annealing at elevated temperature. In an embodiment, bonding is eutectic bonding that includes the deposition of metallic films on the wafer surfaces; aligning the wafers such that the surfaces are in contact and the metallic films are in contact; and heating to elevated temperature to allow the metallic films to diffuse into one another.

The process for making alkali metal vapor cell 200 further can include dicing, after bonding the sealing wafer 220 to the preform wafer 210, the preform wafer 210 to provide a select number of make individually sealed alkali metal vapor cells 200. Dicing includes abrasive machining or laser cutting of the parts of the wafer between the cells 200 without disrupting the seal formed by the bonding.

The process for making alkali metal vapor cell 200 further can include introducing a buffer gas in the cell cavity 216, wherein the alkali metal is inert to the buffer gas. Introducing the buffer gas can include filling bonding chamber interior 298 of bonding chamber 299 in which preform wafer 210 and sealing wafer 220 are enclosed with such gas after the alkali metal precursors are reacted, but before bonding; and bonding in a presence of the buffer gas to seal the buffer gas inside cell cavity 216.

In the process for making alkali metal vapor cell 200, subjecting alkali metal precursor 234 in deposition cavity 238 to a reaction stimulus includes heating the alkali metal precursors to elevated temperature after insertion of sealing wafer 220 and preform wafer 210 into the bonding chamber 299 and evacuation of this chamber of gas. In an embodiment, subjecting alkali metal precursor 234 in deposition assembly 228 to the reaction stimulus includes heating alkali metal precursor 234. Here, electrically resistive heaters in the platen of the bonding machine that hold the deposition assembly 228 are activated by passing an electrical current through them, which results in them getting hot and the heat being transferred to the deposition assembly 228 and alkali metal precursor 234. In an embodiment, subjecting alkali metal precursor 234 in deposition assembly 228 to the reaction stimulus includes irradiating alkali metal precursor 234 with ultraviolet radiation. Here, ultraviolet light is generated from a discharge lamp or laser and is transmitted into the deposition assembly 228 through windows on deposition assembly 228 transparent to ultraviolet light.

In the process for making alkali metal vapor cell 200, disposing alkali metal precursor 234 in deposition cavity 238 includes delivering a liquid composition that includes alkali metal precursor 234 into deposition cavity 238; and heating the liquid to evaporate a solvent of the composition. Heating can occur by placing the preform wafer 210 on a heated surface. Optionally, the liquid composition can be dried by exposing the liquid composition to a dry gaseous environment. Upon drying the liquid composition, alkali metal precursor 234 is stable at room temperature.

In the process for making alkali metal vapor cell 200, bonding sealing wafer 220 to preform wafer 210 to make individually sealed alkali metal vapor cells 200 in preform wafer 210 can include anodic bonding, thermocompression bonding, fusion bonding, eutectic bonding, or a combination thereof. In an embodiment, bonding is anodic bonding that includes the application of elevated voltage across a conductive wafer and a glass or ceramic wafer placed in surface contact at elevated temperature such that impurity ions in the wafers are transported within the wafers resulting in electrostatic forces that pull the wafers together and an oxidation process at the interface that bonds the wafers together. In an embodiment, bonding is fusion bonding that includes placing two silicon wafers in contact after appropriate processing of the wafer surfaces; heating to elevated temperature to form the bond; subsequent annealing at elevated temperature. In an embodiment, bonding is eutectic bonding that includes the deposition of metallic films on the wafer surfaces; the alignment of the wafers such that the surfaces are in contact and the metallic films are in contact; the heating to elevated temperature to allow the metallic films to diffuse into one another. As a result of bonding sealing wafer 220 to preform wafer 210, alkali metal vapor cells 200 are individually sealed.

With reference to, FIG. 2, FIG. 3, FIG. 4, FIG. 5, FIG. 6, FIG. 7, and FIG. 8, alkali metal vapor cell apparatus 250 includes preform wafer 210 having cavity layer 214 disposed on basal member 212; sealing wafer 220 disposed on cavity layer 214; and deposition assembly 228 disposed on sealing wafer 220. Deposition assembly 228 includes exterior surface 254, interior 230 bounded by chamber wall 232, and precursor surface 252 on which alkali metal precursor 234 can be disposed. Deposition assembly 228 can be made of various materials including glass, silicon, metals and the like, including combinations of the aforementioned materials. A cross-sectional shape of deposition assembly 228 can be, e.g., round, square, rectangular and the like. A volume of the deposition assembly 228 can be from 0.001 cm$^3$ to 100 cm$^3$, specifically from 1 cm$^3$ to 5 cm$^3$. Moreover, deposition assembly 228 can be opaque or partially transparent to light at a variety of wavelengths to allow the direction of light into the interior 230 if needed for alkali precursor activation.

Chamber wall 232 of deposition assembly 228 can extend from precursor surface 252 and terminate in contact with sealing wafer 220. Sealing wafer 220 can include cover layer 220 in which is disposed transmission apertures 224 bounded by cover wall 226; and cover surface 256 that contacts cavity layer 214 of preform wafer 210. Sealing wafer 220 can include a polished or unpolished wafer of in which transmission apertures 224 are fabricated to direct the alkali vapor into specific spatial regions defined by transmission apertures 224 while preventing the alkali vapor from being directed into surfaces under cover surface 256 such as the top surface of cavity layer 214 and can be glass, silicon, or metal. Moreover, sealing wafer 220 can be round, square, or some other shape with lateral dimensions between 1 cm and 50 cm and thickness between 0.01 mm and 1 cm. In an embodiment, preform wafer 210 includes a round polished borosilicate or aluminosilicate glass wafer suitable for anodic bonding to silicon, and can be, e.g., 100 mm in diameter and 1 mm thick.

Prior to forming alkali metal condensate 236 from alkali metal precursor 234, cavity layer 214 contacts sealing wafer 220. Cavity layer 214 can include a material compatible with micromachining or additive manufacturing such that cell cavities 216 can be lithographically defined or easily etched, e.g., in parallel using the same process sequence, and can be silicon, glass, or a metal. Moreover, cell cavities 216 can also be abrasively or laser machined. In an embodiment, cavity layer 214 includes a circular polished wafer of silicon, 100 mm in diameter and 1 mm thick, into which cell cavities 216 have been defined using lithographic patterning and subsequently etched using wet chemical etching or deep reactive ion etching. A diameter of cell cavity 216 can be from 10 µm to 10 mm, specifically from 100 µm to 1 mm, and more specifically from 0.5 mm to 1 mm. An axial length of cell cavity 216 can be from 10 µm to 10 mm, specifically from 100 µm to 1 mm, and more specifically from 0.5 mm to 1 mm. An aspect ratio of cell cavity 216, given by a length of the cavity wall 218 to a diameter of the call cavity 216, can be from 0.001 to 1000, specifically from 0.1 to 10 and more specifically from 0.9 to 1.1. A volume of cell cavity 216 can be from 1000 µm$^3$ to 1000 mm$^3$, specifically from $10^{-3}$ mm$^3$ to 10 mm$^3$, and more specifically from 0.1 mm$^3$ to 10 mm$^3$.

Cell cavity 216 of cavity layer 214 terminates at basal member 212. Basal member 212 can be a polished wafer to prevent the release of alkali vapor outside the cell cavity 214 and prevent the contamination of the cell by gases from the outside and can be glass, silicon, and the like. Moreover, basal member 212 may have thin oxide coatings applied to it, e.g., to prevent diffusion of alkali vapor into the glass and control reflections of light from the glass surface. In an embodiment, basal member 212 is a round polished borosilicate or aluminosilicate glass wafer 100 mm in diameter and 1 mm thick. It is contemplated that basal member 212 can include a material with low permeability to helium such as aluminosilicate glass, a material with a thermal expansion with temperature close to that of sealing platen 220. A coefficient of thermal expansion of basal member 212 can be from $1\times10^{-6}$/K to $5\times10^{-6}$/K, specifically from $2.5\times10^{-6}$/K to $2.7\times10^{-6}$/K. A cross-sectional shape of cell cavity 216 can be, e.g., round, square, rectangular, and the like. A volume of cell cavity 216 can be from 1000 µm$^3$ to 1000 mm$^3$, specifically from $10^{-3}$ mm$^3$ to 10 mm$^3$, and more specifically from 0.1 mm$^3$ to 10 mm$^3$. Once sealed, the gas inside cell cavity 216 can have a pressure at room temperature from 0 kPa to 500 kPa, specifically from 30 kPa to 100 kPa, and more specifically from 50 kPa to 60 kPa. It is contemplated that basal member 212 and the cavity layer can be a monolithic component or separate components. For the monolithic component, instead of etching through holes in the Si wafer and bonding glass to one side, blind holes are etched into the wafer such that the wafer includes the basal member and the cavity layer.

Figure 11:
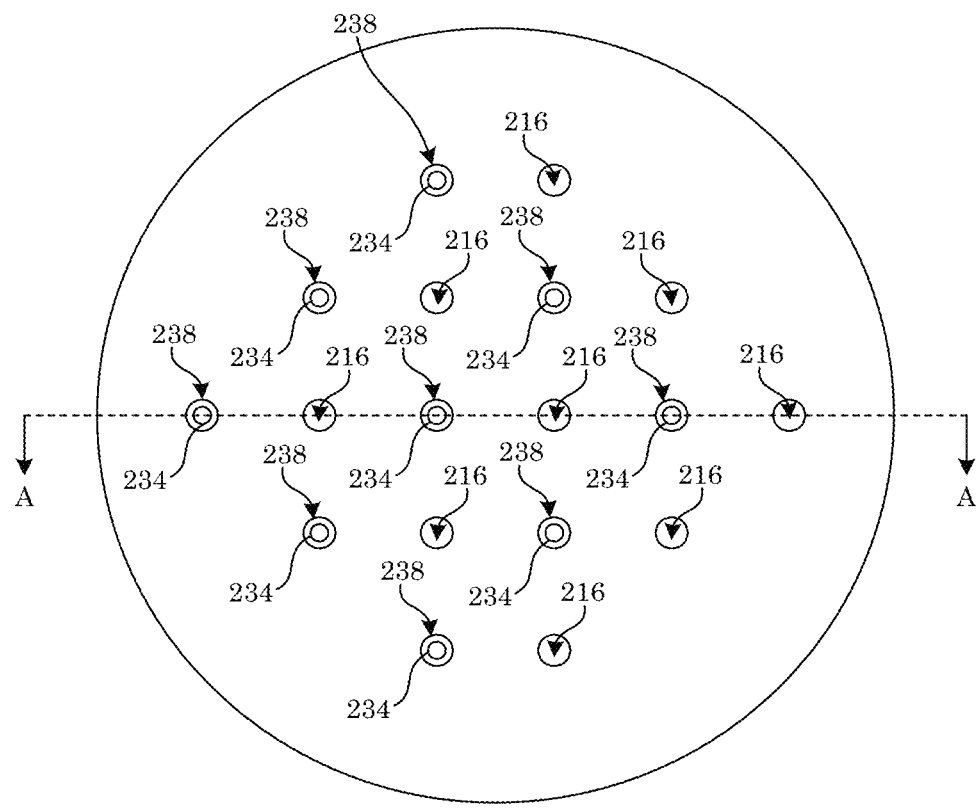
FIG. 11 shows, in panel A, a plan view of a cavity layer having deposition cavities and cell cavities disposed on a basal member for the alkali metal vapor cell apparatus shown in FIG. 10, and panel C shows a cross-section along line A-A shown in panel A.
Figure 11:
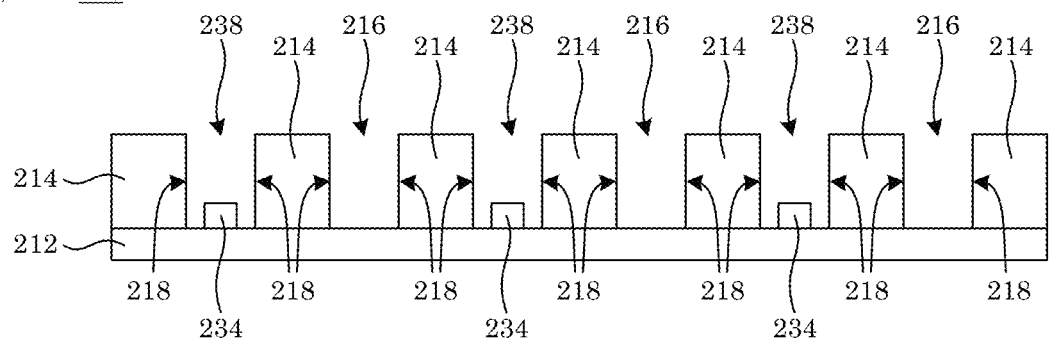
Figure 12:
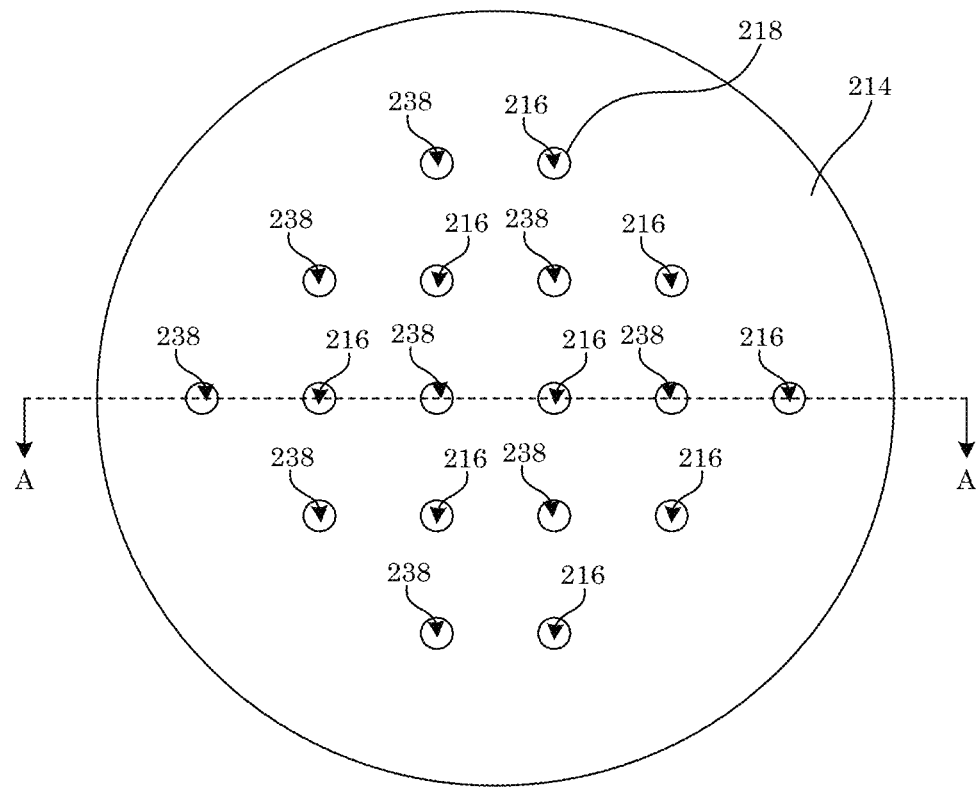
FIG. 12 shows, in panel A, a plan view of the cavity layer shown in FIG. 11, and panel B shows a cross-section along line A-A shown in panel A.
Figure 12:
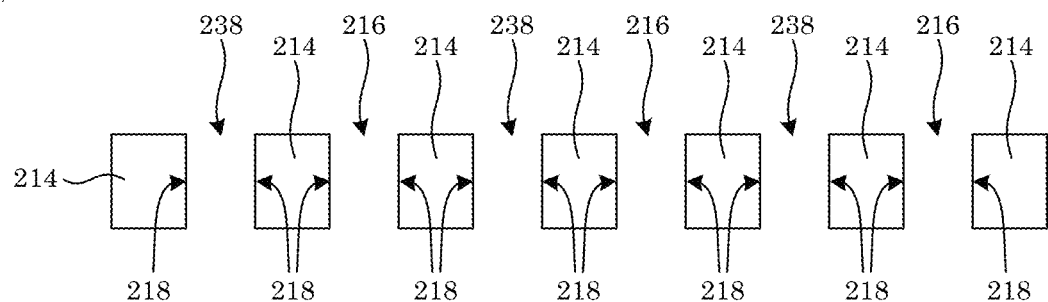
Figure 13:
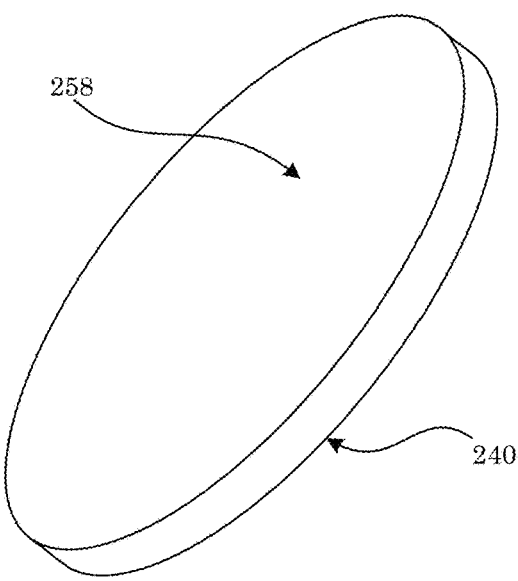
FIG. 13 shows, in panel A, a perspective view of a sealing wafer shown in FIG. 10 prior to forming an alkali metal condensate thereon; panel B shows a plan view of the sealing wafer, and panel C shows a cross-section along line A-A shown in panel B.
Figure 13:
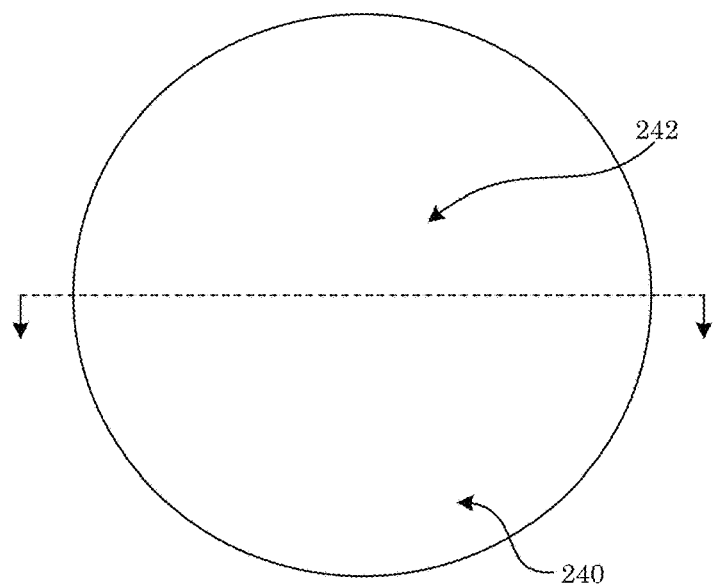
Figure 13:
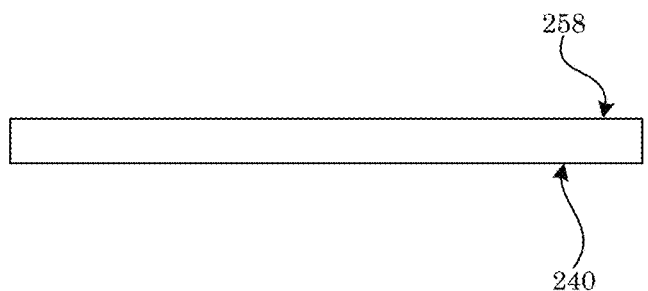
Figure 14:
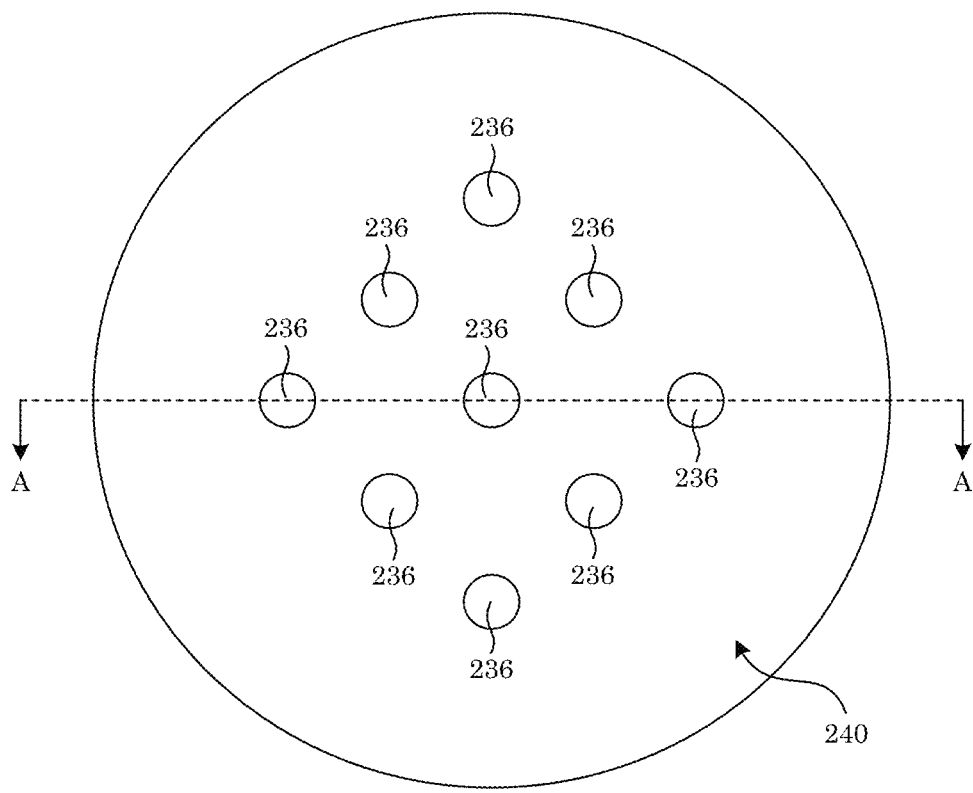
FIG. 14 shows, in panel A, a plan view of the sealing wafer shown in FIG. 13 after forming an alkali metal condensate thereon, and panel B shows a cross-section along line A-A shown in panel A.
Figure 14:
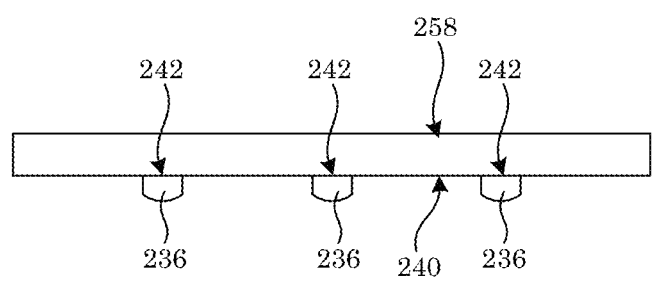

With reference to, FIG. 10, FIG. 11, FIG. 12, FIG. 13, FIG. 14, and FIG. 15, alkali metal vapor cell apparatus 250 includes preform wafer 210 having cavity layer 214 disposed on basal member 212; and sealing wafer 220 disposed on cavity layer 214. Cavity layer 214 includes deposition cavity 238 bounded by cavity wall 218 that are arranged proximate and adjacent to a neighboring cell cavity 216. It is contemplated that, in a row of deposition cavities 238 and cell cavities 216, deposition cavities 238 and cell cavities 216 can be alternatingly disposed cavity layer 214 as shown in FIG. 11. Other arrangements are contemplated such as a row of exclusively deposition cavities 238 arranged adjacent to a row of exclusively cell cavities 216 so that alkali metal condensate 236 can be transferred on sealing wafer 220 between deposition cavity 238 and cell cavity 216. Lateral translation of sealing wafer 220 relative to preform wafer 210 includes linear translation and rotary translation. A number of deposition cavities 238 and a number of cell cavities 216 can be selected based on a density of alkali metal vapor cell 200 on preform wafer 210 desired. Moreover, as shown in FIG. 13, sealing wafer 220 can include a blank with exterior surface 258 and deposition surface 240 arranged on opposite faces of sealing wafer 220. Deposition surface 240 receives alkali metal condensate 236 from alkali metal precursor 234 disposed in deposition cavity 238.

Alkali metal precursor 234 can include an alkali halide, an azide, a chromate, a molibdate, or a combination thereof, and can be combined with a reducing agent such as barium azide, calcium, zirconium or aluminum. Exemplary alkali halides include RbCl, CsCl, KCl, RbBr, CsBr, RbBr, and the like. Exemplary alkali azides include $RbN_3$, $CsN_3$, $KN_3$, and the like. It is contemplated that alkali metal precursor 234 can include $RbN_3$, $CsN_3$, $KN_3$ that produce alkali metal in response to be subjected to ultraviolet light. Alkali halides can be reacted with $BaN_6$ or Ca to produce alkali metal. In an embodiment, alkali metal precursor 234 includes $BaN_6$ and an alkali chloride, which react to form BaCl, $N_2$, and alkali metal in response to heating. The alkali metal and alkali metal condensate 236 independently can include potassium, rubidium, cesium, or a combination thereof.

Alkali metal precursor 234 can be disposed in a liquid composition for delivery to deposition assembly 228 or deposition cavity 238. In addition to alkali metal precursor 234, the liquid composition can include a solvent for mixing of constituents of alkali metal precursor 234 and communicating alkali metal precursors 234 into deposition cavity 238. Exemplary solvents include water, alcohol, and the like.

Buffer gas can be included in alkali metal vapor cell 200. The buffer gas is inert to the alkali metal, and exemplary buffer gases include $N_2$, Ar, Ne, $CH_4$, and the like. The buffer gas can have a partial pressure at room temperature from 0 kPa to 500 kPa, specifically from 30 kPa to 100 kPa, and more specifically from 50 kPa to 60 kPa.

Alkali metal vapor cell 200, alkali metal vapor cell apparatus 250, and processes disclosed herein have numerous beneficial uses, including as an alkali metal vapor source in atomic clocks, atomic magnetometers, gyroscopes based on nuclear magnetic resonance, wavelength references, quantum information storage devices, voltage references, current references, temperature sensors and other sensors and instruments. Advantageously, alkali metal vapor cell 200, alkali metal vapor cell apparatus 250, and processes disclosed herein overcome technical deficiencies of conventional articles or processes, e.g., alkali vapor cells made using glass-blowing techniques, microfabricated alkali vapor cells made using alkali precursors that remain in the cell after bonding and activation, and the like.

Moreover, alkali metal vapor cell 200, alkali metal vapor cell apparatus 250, and processes herein have numerous advantageous properties. In an aspect, large numbers of alkali vapor cells can be fabricated on a single set of wafers using a single process that reduces fabrication cost and cell-to-cell variability as compared with conventional processes. Very small alkali vapor cells can be fabricated by adjusting the dimensions of the lithographic process used to fabricate transmission apertures 224, cell cavities 216, and deposition cavities 238. Vapor cells with very few impurities can be fabricated since alkali metal precursors remain in a physical location separate from the alkali vapor cell after reaction. Moreover, vapor cells with many buffer gas compositions over a large range of pressures, or no buffer gas at all, can be fabricated.

Alkali metal vapor cell 200, alkali metal vapor cell apparatus 250, and processed herein unexpectedly uses deposition cavities integrated onto the wafer containing the cell cavities or integrated in a second deposition wafer that can be fabricated to match the cell cavity pattern on the preform wafer. Advantageously, processes herein include physical translation, under vacuum, of one wafer with respect to a second wafer for deposition of the alkali metal into the cell before translation and provide a clean and contiguous bonding surface over the openings in the cell cavities after translation.

The articles and processes herein are illustrated further by the following Examples, which are non-limiting.

EXAMPLE

Compact, alkali metal vapor cells produced on a wafer preform.

Figure 15:
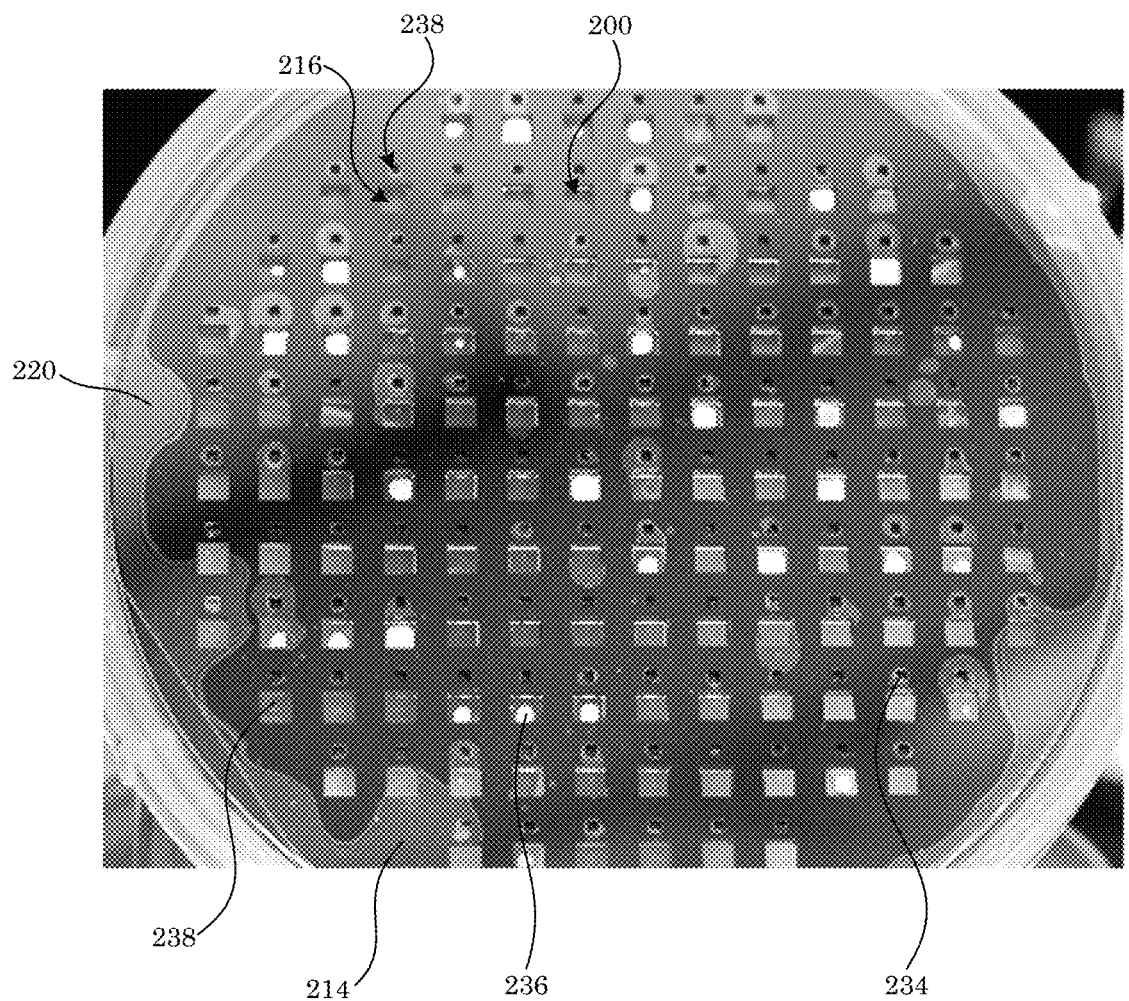
FIG. 15 shows a plurality of alkali metal vapor cells in an alkali metal vapor cell apparatus.

FIG. 15 shows a wafer of alkali vapor cells fabricated using the processes described herein. Shown are deposition cavities 216 and cell cavities 238 with alkali metal condensate 236 visible in cell cavities 238 as whitish material. This wafer of cells was fabricated with as described herein with no buffer gas intentionally introduced into the cavity. Successful bonding is indicated by darker regions between cell cavities and deposition cavities. The image was acquired through transparent glass sealing wafer 220 and onto opaque, black silicon cavity layer 214. The cell cavities and deposition cavities were fabricated using lithographic patterning and deep reactive ion etching of silicon.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity). The conjunction "or" is used to link objects of a list or alternatives and is not disjunctive; rather the elements can be used separately or can be combined together under appropriate circumstances.

What is claimed is:

1. A process for making a plurality of alkali metal vapor cells, the process comprising:
    providing a preform wafer comprising:
        a basal member;
        a cavity layer disposed on the basal member; and
        a plurality of cell cavities disposed in the cavity layer and bounded by a cavity wall of the cavity layer;
    providing a sealing wafer comprising:
        a cover layer; and
        a plurality of transmission apertures disposed in the cover layer and bounded by a cover wall of the cover layer;
    disposing a deposition assembly on the sealing wafer in fluid communication with the transmission apertures of the sealing wafer such that the sealing wafer is interposed between the preform wafer and the deposition assembly;
    disposing an alkali metal precursor in the deposition assembly;
    disposing the sealing wafer on the preform wafer;
    aligning the transmission apertures of the sealing wafer with the cell cavities such that the transmission apertures of the sealing wafer are in fluid communication with the cell cavities of the preform wafer;
    subjecting the alkali metal precursor in the deposition assembly to a reaction stimulus;
    producing, from the alkali metal precursor, alkali metal vapor in the deposition assembly in response to subjecting the alkali metal precursor to the reaction stimulus;
    communicating, simultaneously in parallel, the alkali metal vapor from the deposition assembly to the cell cavities through the transmission apertures;
    receiving, in the cell cavities, the alkali metal vapor from the transmission apertures;
    producing, from the alkali metal vapor, an alkali metal condensate in the cell cavity;
    moving the sealing wafer laterally with respect to the preform wafer such that the cover layer encapsulates the alkali metal condensate in the cell cavities; and
    bonding the sealing wafer to the preform wafer to make individually sealed alkali metal vapor cells in the preform wafer.

2. The process of claim 1, further comprising removing the deposition assembly, from the sealing wafer after producing, from the alkali metal precursor, alkali metal vapor in the deposition assembly.

3. The process of claim 1, further comprising dicing, after bonding the sealing wafer to the preform wafer, the preform wafer to provide a select number of individually sealed alkali metal vapor cells.

4. The process of claim 1, further comprising introducing a buffer gas in the cell cavity, the alkali metal being inert to the buffer gas.

5. The process of claim 1, wherein subjecting the alkali metal precursor in the deposition assembly to the reaction stimulus comprises heating the alkali metal precursor.

6. The process of claim 1, wherein subjecting the alkali metal precursor in the deposition assembly to the reaction stimulus comprises irradiating the alkali metal precursor with ultraviolet radiation.

7. The process of claim 1, wherein disposing the alkali metal precursor in the deposition assembly comprises:
delivering a liquid composition comprising the alkali metal precursor into the deposition assembly; and
heating the liquid composition to evaporate a solvent of the liquid composition.

8. The process of claim 1, wherein bonding the sealing wafer to the preform wafer comprises anodic bonding, fusion bonding, eutectic bonding, or a combination thereof;
the cavity layer comprises a silicon wafer;
the basal member and the cover layer independently comprise glass; and
a volume of the cell cavity is from 100 $\mu m^3$ to 10 $mm^3$.

9. The process of claim 1, wherein the alkali eta precursor comprises an alkali halide, an azide, or a combination thereof.

10. The process of claim 1, wherein the alkali metal precursor and the alkali metal condensate independently comprise potassium, rubidium, cesium, or a combination comprising a plurality of the foregoing alkali metals.

11. A process for making a plurality of alkali metal vapor cells, the process comprising:
providing a preform wafer comprising:
a basal member;
a cavity layer disposed on the basal member;
a plurality of cell cavities disposed in the cavity layer and bounded by a cavity wall of the cavity layer; and
a plurality of deposition cavities disposed in the cavity layer and bounded by the cavity wall of the cavity layer, such that each deposition cavity is adjacent to a cell cavity;
disposing an alkali metal precursor in the deposition cavity of the preform wafer;
providing a sealing wafer comprising a cover layer that comprises a blank;
disposing the sealing wafer on the preform wafer so that a deposition surface of the sealing wafer faces and is in fluid communication with the deposition cavities of the preform wafer, such that the deposition cavities are individually isolated from fluid communication with other deposition cavities and cell cavities;
subjecting the alkali metal precursor in the deposition cavities to a reaction stimulus;
producing, from the alkali metal precursor, alkali metal vapor in the deposition cavities in response to subjecting the alkali metal precursor to the reaction stimulus;
communicating, simultaneously in parallel, the alkali metal vapor from the deposition cavity to a deposition area on the deposition surface of the sealing wafer that covers the deposition cavity, such that each deposition area is local to an individual deposition cavity and physically, separate from other deposition cavities and cell cavities;
contacting the deposition area with the alkali metal vapor from the deposition cavity;
producing, from the alkali metal vapor, an alkali metal condensate on the deposition area;
separating the sealing wafer from the preform wafer;
moving the sealing wafer laterally with respect to the preform wafer and aligning the deposition areas of the sealing wafer with the cell cavities of the preform wafer such that the individual deposition areas of the sealing wafer are in fluid communication with an individual cell cavity of the preform wafer in an aligned position and contacting the sealing wafer with the preform wafer in the aligned position to encapsulate the alkali metal condensate in individual deposition area in individual cell cavities; and
bonding the sealing wafer to the preform wafer to make individually sealed alkali metal vapor cells in the preform wafer.

12. The process of claim 11, further comprising dicing, after bonding the sealing wafer to the preform wafer, the preform wafer to provide a select number of make individually, sealed alkali metal vapor cells.

13. The process of claim 11, further comprising introducing a buffer gas in the cell cavity, the alkali metal being inert to the buffer gas.

14. The process of claim 11, wherein subjecting the alkali metal precursor in the deposition cavity to the reaction stimulus comprises heating the alkali metal precursor.

15. The process of claim 11, wherein subjecting the alkali metal precursor in the deposition cavity to the reaction stimulus comprises irradiating the alkali metal precursor with ultraviolet radiation.

16. The process of claim 1, wherein disposing the alkali metal precursor in the deposition cavity comprises:
delivering a liquid composition comprising the alkali metal precursor into the deposition cavity; and
heating the liquid composition to evaporate a solvent of the liquid composition.

17. The process of claim 1, wherein:
bonding the sealing wafer to the preform wafer comprises anodic bonding, fusion bonding, eutectic bonding, or a combination thereof;
the cavity layer comprises a silicon wafer;
the basal member and the cover layer independently comprise glass; and
a volume of the cell cavity is from 100 $\mu m^3$ to 10 $mm^3$.

18. The process of claim 1, wherein the alkali metal precursor comprises an alkali halide, an azide, or a combination thereof.

19. The process of claim 1, wherein the alkali precursor metal and the alkali metal condensate independently comprise potassium, rubidium, cesium, or a combination comprising a plurality of the foregoing alkali metals.

* * * * *